US012570456B2

(12) United States Patent
Horio

(10) Patent No.: US 12,570,456 B2
(45) Date of Patent: Mar. 10, 2026

(54) CUSHIONING MATERIAL, PACKING BODY, AND PACKING METHOD

(71) Applicant: SUMCO CORPORATION, Tokyo (JP)

(72) Inventor: Tomohiro Horio, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 18/724,313

(22) PCT Filed: Nov. 14, 2022

(86) PCT No.: PCT/JP2022/042295
§ 371 (c)(1),
(2) Date: Jun. 26, 2024

(87) PCT Pub. No.: WO2023/127332
PCT Pub. Date: Jul. 6, 2023

(65) Prior Publication Data
US 2025/0066099 A1 Feb. 27, 2025

(30) Foreign Application Priority Data
Dec. 28, 2021 (JP) ................................ 2021-213749

(51) Int. Cl.
*B65D 85/30* (2006.01)
*B65D 77/04* (2006.01)
(Continued)

(52) U.S. Cl.
CPC ........... *B65D 81/133* (2013.01); *B65D 77/04* (2013.01); *B65D 2577/048* (2013.01); *H01L 21/6735* (2013.01); *H01L 21/67369* (2013.01)

(58) Field of Classification Search
CPC .... B65D 77/04; B65D 81/113; B65D 81/133; B65D 85/30; B65D 2577/048; H01L 21/673; H01L 21/67369
(Continued)

(56) References Cited

U.S. PATENT DOCUMENTS 4,640,418 A * 2/1987 Lowry ................... B65D 5/509
206/499
5,706,951 A * 1/1998 Oinuma ............ H01L 21/67396
206/592
(Continued)

FOREIGN PATENT DOCUMENTS

JP H09-99979 A 4/1997
JP 2007-137454 6/2007
(Continued)

OTHER PUBLICATIONS

International Preliminary Report on Patentability issued in WIPO Patent Application No. PCT/JP2022/042295, dated Jun. 20, 2024, along with an English translation thereof.
(Continued)

*Primary Examiner* — Luan K Bui
(74) *Attorney, Agent, or Firm* — GREENBLUM & BERNSTEIN, P.L.C.

(57) ABSTRACT

There is provided a cushioning material, the cushioning material including a lower cushioning material that supports a lower portion of each of two rows of containers on a lower tier, middle cushioning materials that are interposed between the containers on an upper tier and the containers on the lower tier, and upper cushioning materials that are disposed in each of the two rows of the containers on the upper tier and that hold each of an upper portion of the containers on the upper tier, in which the lower cushioning material is formed without a space between the lower cushioning material and side plates of a packing case and the middle cushioning materials and the upper cushioning materials are formed with a predetermined space between the middle cushioning materials and the upper cushioning materials and the side plates of the packing case.

8 Claims, 22 Drawing Sheets

(51) Int. Cl.
    *B65D 81/133*     (2006.01)
    *H01L 21/673*     (2006.01)

(58) Field of Classification Search
    USPC ....... 206/454, 499, 523, 589, 710, 711, 722,
                          206/723, 725, 832
    See application file for complete search history.

(56)                References Cited

U.S. PATENT DOCUMENTS

| | | | | |
|---|---|---|---|---|
| 5,875,896 | A * | 3/1999 | Liang ................ | H01L 21/67366 |
| | | | | 206/593 |
| 7,395,922 | B1 * | 7/2008 | Sinha ...................... | F42B 39/24 |
| | | | | 206/593 |
| 7,810,639 | B2 * | 10/2010 | Djulaini ............... | B65D 81/113 |
| | | | | 206/307 |
| 8,047,377 | B2 * | 11/2011 | Makino .................. | B65D 71/70 |
| | | | | 206/561 |
| 2007/0151896 | A1 | 7/2007 | Lu | |

FOREIGN PATENT DOCUMENTS

| | | | | |
|---|---|---|---|---|
| JP | 2013-249126 | A | | 12/2013 |
| JP | 2015-209222 | A | | 11/2015 |
| JP | 2018-107216 | A | | 7/2018 |
| JP | 2019-55794 | A | | 4/2019 |
| JP | 2019055794 | A | * | 4/2019 |
| JP | 2020-40734 | A | | 3/2020 |
| WO | 2015/015615 | | | 2/2015 |
| WO | 2015/029173 | A1 | | 3/2015 |

OTHER PUBLICATIONS

International Search Report issued in WIPO Patent Application No. PCT/JP2022/042295, dated Jan. 31, 2023, along with an English translation thereof.

Aug. 19, 2025 Japanese Office Action in corresponding Japanese patent application No. 2023-570721 and English translation thereof.

Nov. 14, 2025 Korean Office Action in Korean Patent Application No. 10-2024-7024952 and English translation thereof.

* cited by examiner

F I G. 1
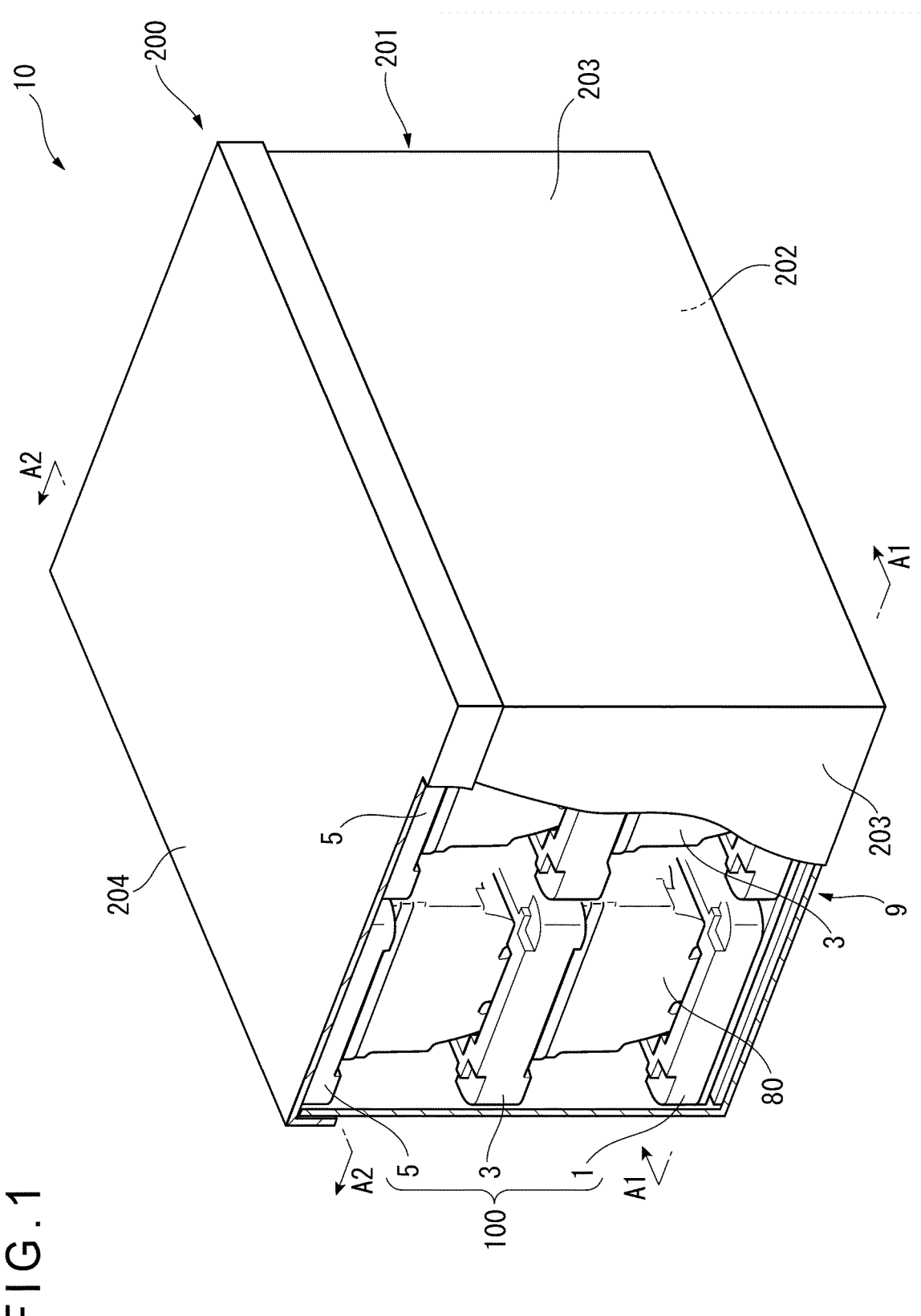

FIG.14

F I G . 1 8
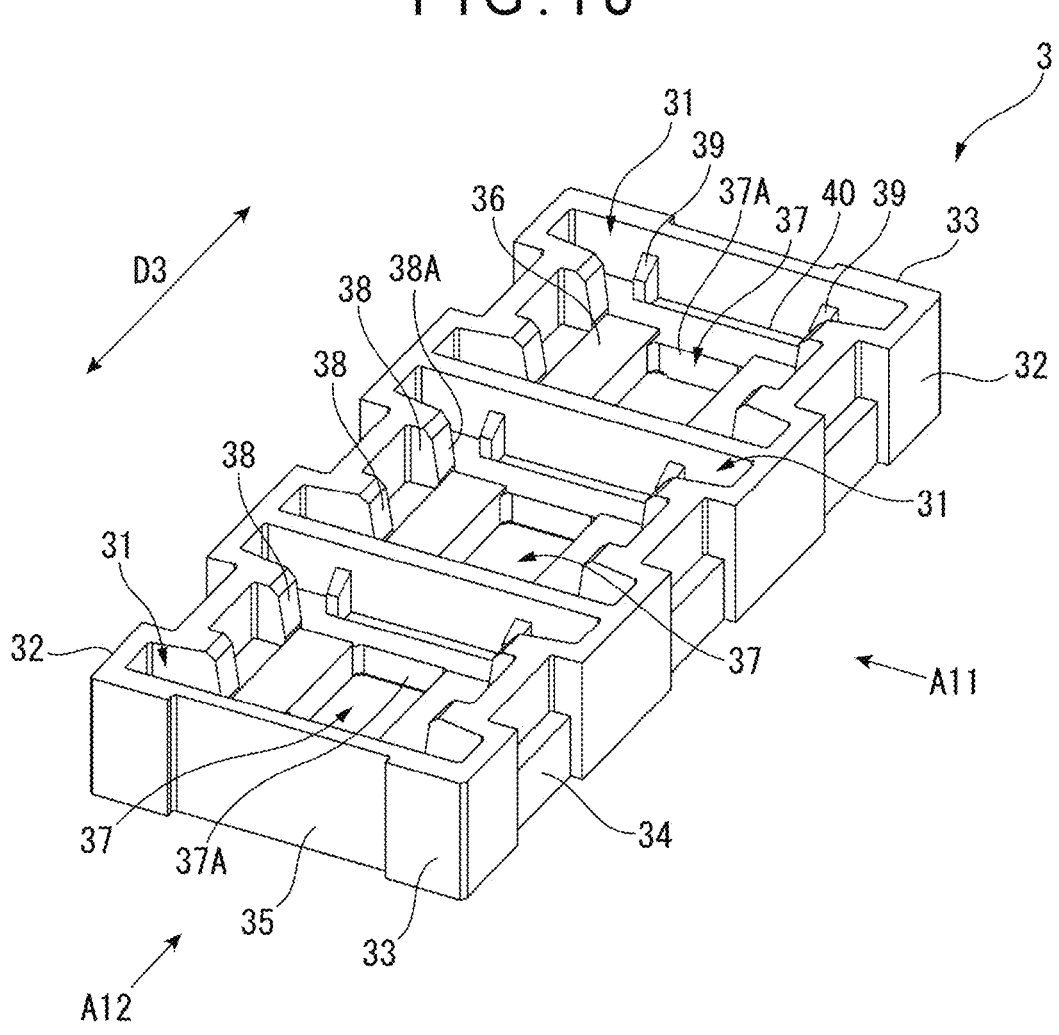

CUSHIONING MATERIAL, PACKING BODY, AND PACKING METHOD

TECHNICAL FIELD

The present invention relates to a cushioning material to be used as a cushioning material for wafer containers and the like, a packing body, and a packing method.

BACKGROUND ART

In general transport of semiconductor wafers, a plurality of containers in each of which a plurality of semiconductor wafers are stored are prepared, and, after the plurality of containers are packed in a packing case, the packing case is transported by a carrying device.

During transport, external force such as impact of, for example, falling of the packing case from the carrying device may act on the containers. Thus, there is a demand for a structure with which semiconductor wafers are not deformed or damaged by external force. As such a structure, a structure in which a cushioning material is provided between containers and a packing case is known.

Patent Literature 1 describes a cushioning material to be used for packing a plurality of containers on two tiers including an upper tier and a lower tier in a packing case, the cushioning material including a lower cushioning material that supports the containers on the lower tier, a middle cushioning material interposed between the containers on the upper tier and the containers on the lower tier, and an upper cushioning material that holds an upper portion of each of the containers on the upper tier.

CITATION LIST

Patent Literature

Patent Literature 1: Japanese Unexamined Patent Application Publication No. 2018-107216

SUMMARY OF THE INVENTION

Problem(s) to be Solved by the Invention

The cushioning material described in Patent Literature 1 has no space between the upper cushioning material and an inner surface of the packing case and a lateral surface of the upper cushioning material is in contact with the inner surface of the packing case. Thus, in Patent Literature 1, stability in removal of the cushioning material by a work robot or the like after a cover of a packing case is detached is impaired.

An object of the invention is to provide a cushioning material, a packing body, and a packing method with which the cushioning material disposed between a plurality of containers in a packing case can be stably removed.

Means for Solving the Problem(s)

A cushioning material according to an aspect of the invention is a cushioning material that is disposed, in a case where a plurality of containers each capable of storing a semiconductor wafer are packed in a box-shaped packing case including a bottom plate, side plates, and a cover, between the packing case and the plurality of containers, the containers being disposed such that two rows in each of which a plurality of the containers are arranged are disposed on each of two tiers including an upper tier and a lower tier, the cushioning material including, for cushioning storage of the containers in the two rows on each of the two tiers, a lower cushioning material that supports a lower portion of each of the two rows of the containers on the lower tier, middle cushioning materials that are interposed one each between the containers on the upper tier and the containers on the lower tier in each of the rows of the containers, and upper cushioning materials that are disposed one each in each of the two rows of the containers on the upper tier and that hold an upper portion of each of the containers on the upper tier, in which the lower cushioning material is formed without a space between the lower cushioning material and the side plates of the packing case, and the middle cushioning materials and the upper cushioning materials are formed with a predetermined space between the middle cushioning materials and the side plates of the packing case and between the upper cushioning materials and the side plates of the packing case.

In the aforementioned cushioning material, at least the upper cushioning materials or the middle cushioning materials may each have, at a lateral surface extending along an inner surface of the packing case, a recess that is formed to be recessed in a direction away from the inner surface of the packing case.

In the aforementioned cushioning material, the predetermined space may be in a range from 5 mm to 20 mm.

In the aforementioned cushioning material, a predetermined cushioning-material interval may be provided between the upper cushioning materials that are two upper cushioning materials.

In the aforementioned cushioning material, a predetermined cushioning-material interval may be provided between the middle cushioning materials that are two middle cushioning materials.

In the aforementioned cushioning material, the cushioning-material interval may be in a range from 5 mm to 20 mm.

A packing body according to another aspect of the invention is a packing body including any one of the aforementioned cushioning materials, the packing body including the plurality of containers, the packing case, and the cushioning material that is disposed with a predetermined space between the middle cushioning materials and the side plates of the packing case and between the upper cushioning materials and the side plates of the packing case.

A packing method according to a still another aspect of the invention is a packing method using any one of the aforementioned cushioning materials, the packing method including disposing the cushioning material inside the packing case with a predetermined space between the middle cushioning materials and the side plates of the packing case and between the upper cushioning materials and the side plates of the packing case, and packing the containers.

According to the aspects of the invention, the predetermined space is provided between the middle cushioning materials and the side plates of the packing case and between the upper cushioning materials and the side plates of the packing case, which makes it possible to stably remove the cushioning material.

BRIEF DESCRIPTION OF DRAWINGS

FIG. 1 is a perspective view of a packing body in which containers and a cushioning material are disposed inside a packing case.

FIG. 14 is a top perspective view of the upper cushioning material in the exemplary embodiment of the invention.

FIG. 18 is a top perspective view of a middle cushioning material in the exemplary embodiment of the invention.

DESCRIPTION OF EMBODIMENT

Figure 2:
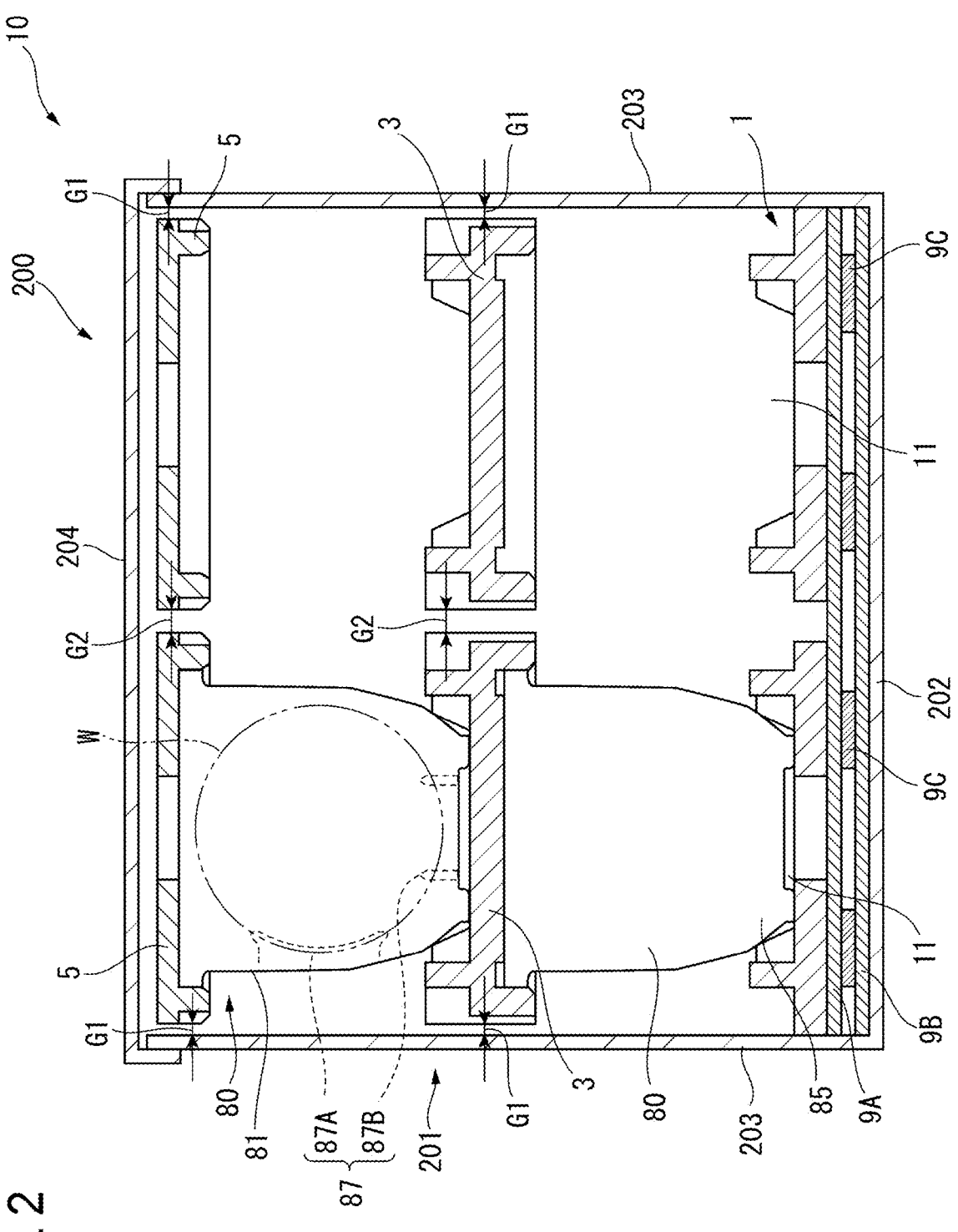
FIG. 2 is a sectional view taken along a line A1-A1 in FIG. 1.

Hereinafter, a suitable exemplary embodiment of the invention will be described in detail with reference to the accompanying drawings.

A cushioning material according to the invention is disposed, when a plurality of containers each capable of storing a semiconductor wafer(s) are packed in a packing case, between the packing case and the plurality of containers. A packing body includes a plurality of containers, a packing case, and a cushioning material disposed between the packing case and the plurality of containers.

First, the packing case in which the plurality of containers are to be packed will be described. As illustrated in FIG. 1, a packing case 200 is a case having an accommodation space in a rectangular cuboid shape and in which a plurality (twelve in the exemplary embodiment) of containers 80 are to be packed together with a cushioning material 100. The number of the containers 80 to be packed is not limited to twelve.

The packing case 200 includes a case body 201 that has a rectangular cuboid shape whose one face, which is an upper face in FIG. 1, is open and a case cover 204 that closes the upper face of the case body 201, the case body 201 and the case cover 204 forming a box shape as a whole. The case body 201 is constituted by four side plates 203 that are connected to each other and form a quadrangular tubular shape, and a bottom plate 202 that closes a bottom thereof. The packing case 200 can be formed from a material, for example, card board, plastic, metal such as aluminum, or wood that is able to withstand transport by a truck or the like.

Next, arrangement of the cushioning material 100 and the containers 80 will be described.

Figure 3:
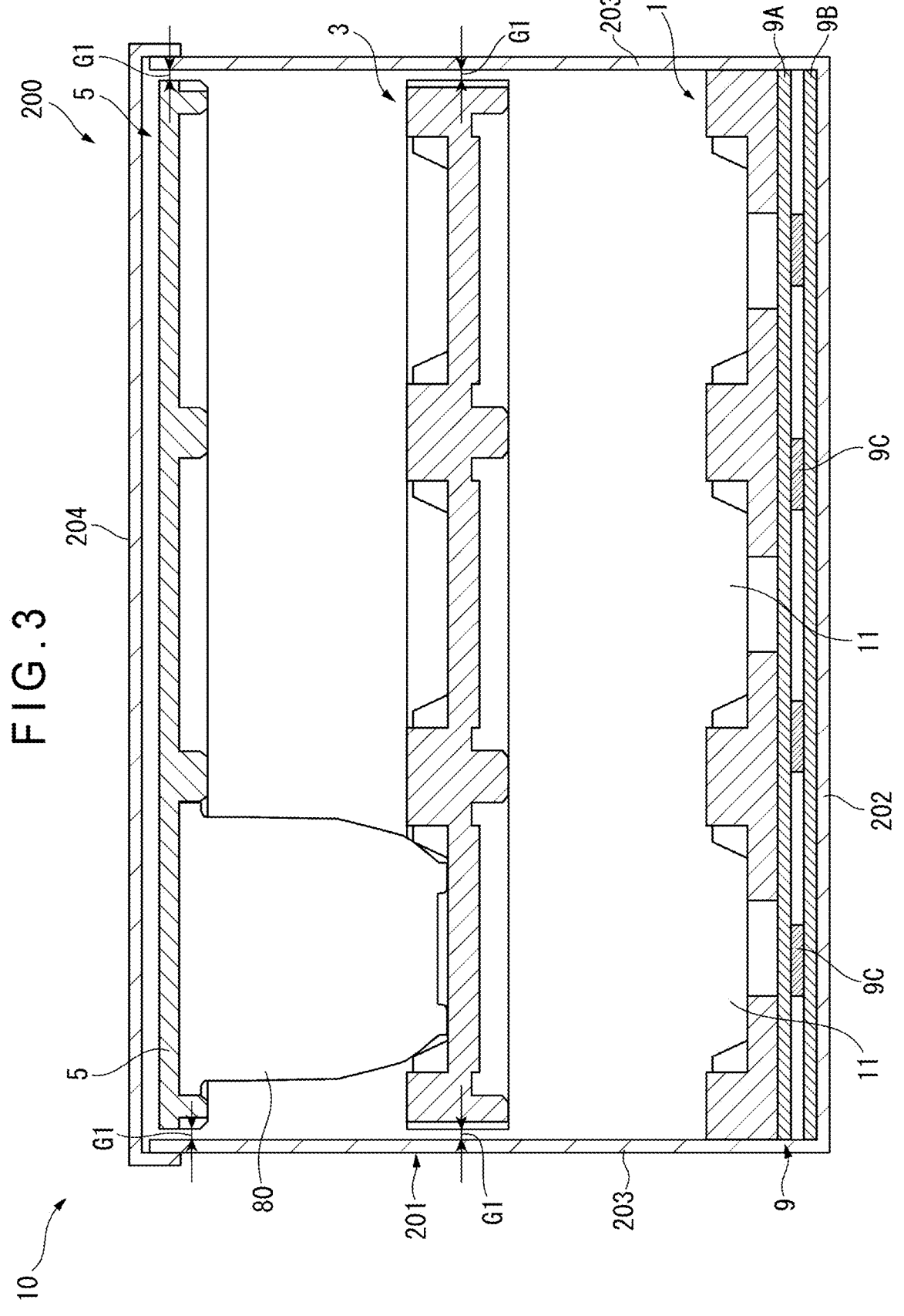
FIG. 3 is a sectional view taken along a line A2-A2 in FIG. 1.

As illustrated in FIG. 1 to FIG. 3, twelve containers 80 in total are disposed inside the packing case 200 in the exemplary embodiment such that two rows in each of which three containers 80 are arranged are disposed in a horizontal (lateral) direction on each of two tiers including an upper tier and a lower tier. The number of the containers 80 in each row of the containers 80 is not limited thereto, and, for example, two rows in each of which two containers 80 are arranged may be disposed on each of two tiers including an upper tier and a lower tier.

For cushioning storage of the containers 80 in the two rows on each of the two tiers, the cushioning material 100 includes a lower cushioning material 1 that supports a lower portion of each of the containers 80 in the two rows on the lower tier, middle cushioning materials 3 that are interposed one each between each of the rows of the containers 80 on the upper tier and each of the rows of the containers 80 on the lower tier, and upper cushioning materials 5 that are disposed one each in each of the two rows of the containers 80 on the upper tier and that hold an upper portion of each of the containers 80 on the upper tier.

The cushioning material 100 further includes a vibration absorber 9 that is disposed between the lower cushioning material 1 and the bottom plate 202 of the packing case 200.

In other words, a packing body 10 is the packing case 200 in which the twelve containers 80, the two upper cushioning materials 5, the two middle cushioning materials 3, and the lower cushioning material 1 are disposed.

Figure 5:
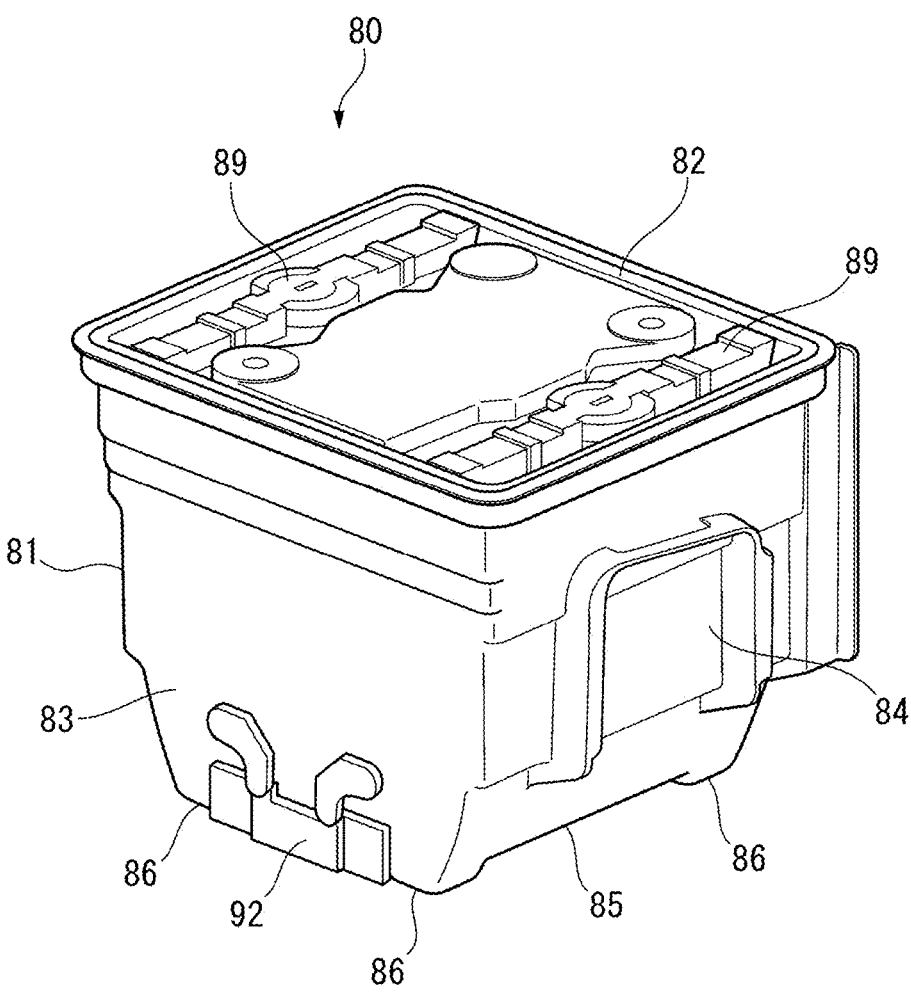
FIG. 5 is a perspective view of the container.

Next, the containers 80 will be described. The containers 80 are containers for storing semiconductor wafers W and are each, for example, a front opening shipping box (FOSB). As illustrated in FIG. 5, each of the containers 80 includes a container body 81 whose upper side is open, and a container cover 82 that closes the upper side of the container body 81.

The container body 81 integrally includes a pair of first walls 83 that face each other, a pair of second walls 84 that face each other and that form, together with the pair of first walls 83, lateral surfaces of the container body 81, and a bottom 85 that closes a lower side of the container body 81. The container body 81 is formed to have a rectangular opening on the upper side.

The container body 81 includes, at the bottom 85, a plurality of legs 86, which are provided one each at four corners in the exemplary embodiment. The legs 86 protrude downward from the bottom 85.

As illustrated in FIG. 2, a comb-shaped wafer holder 87 that has holding grooves for holding the semiconductor wafers W with a space therebetween is provided inside the container body 81 of each of the containers 80.

The wafer holder 87 is constituted by side holders 87A that are to be in contact with an outer edge side portion of each of the semiconductor wafers W, and bottom holders 87B that are provided on an inner side of the bottom 85 and that are to be in contact with an outer edge bottom portion of each of the semiconductor wafers W.

One row of the side holder 87A is provided on an inner side of each of the second walls 84 facing each other. Two bottom holders 87B are provided directly on the bottom 85. The two side holders 87A are disposed at a corresponding one of the second walls 84 to be parallel to each other in a groove arrangement direction, in other words, a direction orthogonal to the sheet of FIG. 2.

Figure 6A:
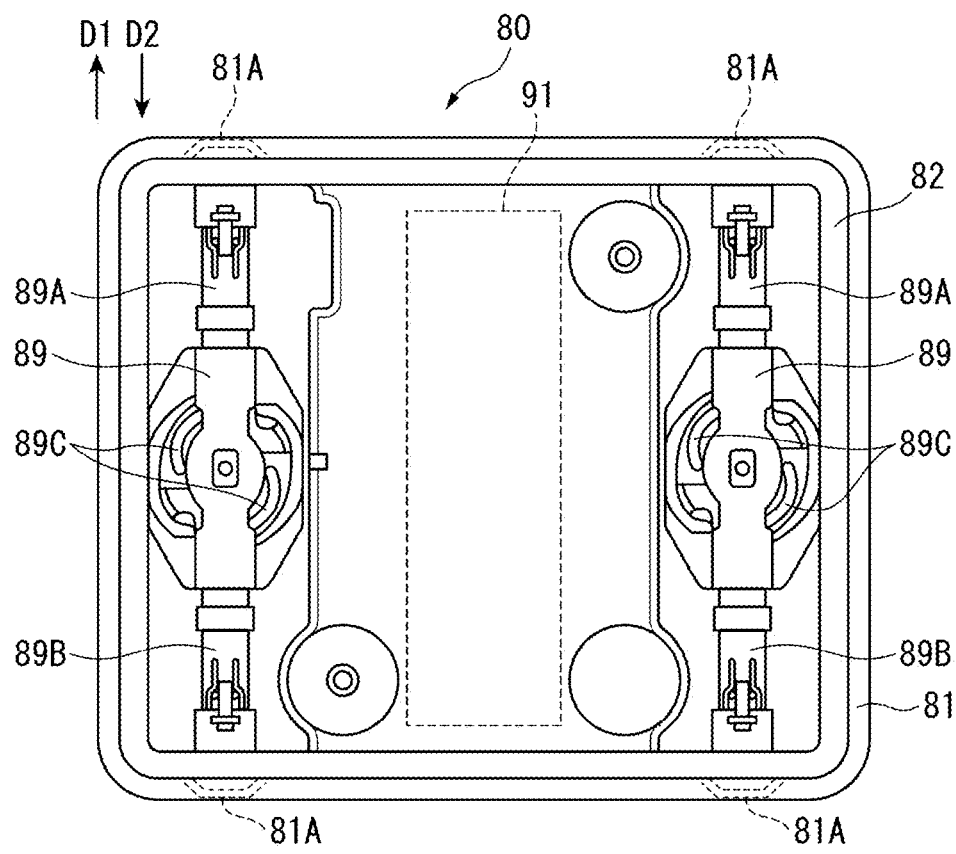
FIG. 6A is a top view of the container.
Figure 6B:
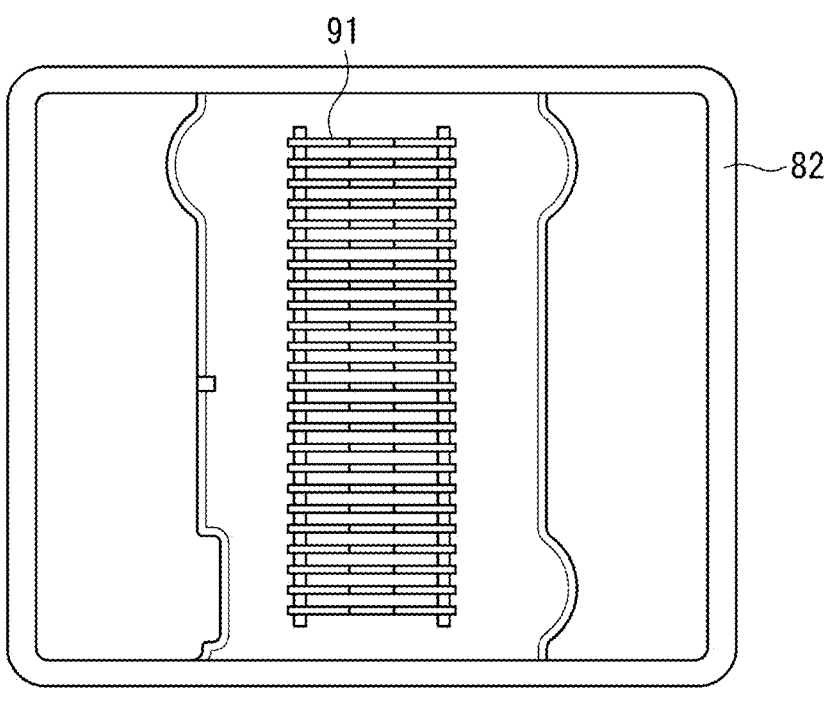
FIG. 6B is a rear view of a container cover.

The container cover 82 is a plate-shaped member whose planar shape is rectangular and, as illustrated in FIG. 5, FIG. 6A, and FIG. 6B, includes a pair of locks 89 on a surface side and a retainer 91 on a rear surface (inner surface) side.

The locks 89 are members that fix the container cover 82 to the container body 81 and, as illustrated in FIG. 6A, each include lock bars 89A and 89B and a latch mechanism 89C.

The lock bars 89A and 89B are members that are provided along sides of the container cover 82 facing each other and are movable in a direction D1 or D2 in FIG. 6A.

By rotationally moving the latch mechanism 89C, the lock bar 89A and the lock bar 89B can be moved by a cam mechanism in the direction D1 and the direction D2, respectively. Consequently, respective ends of the lock bars 89A and 89B engage with corresponding recesses 81A of the container body 81 and fix the container cover 82 to the container body 81. The fixation of the container body 81 is cancelled by, in the state where the container cover 82 is fixed to the container body 81, returning the position of the latch mechanism 89C to an original position thereof to thereby pull and return the lock bars 89A and 89B to an inner side of the container cover 82.

As illustrated in FIG. 6B, the retainer 91 is a vertically elongated comb-shaped member that is provided on a rear surface side of the container cover 82 and is provided between the locks 89. The retainer 91 allows respective upper peripheral edges of the semiconductor wafers W stored in the container body 81 to be inserted between comb teeth and to come into contact with the retainer 91, thereby restricting the movement of the semiconductor wafers W in an axial direction or the turning of the semiconductor wafers W in a radial direction and retaining the semiconductor wafers W not to come into contact with each other.

As with a general wafer container, the comb shape of each of the side holders 87A and the bottom holders 87B of the wafer holder 87 is similar to the comb shape of the retainer 91.

In FIG. 6B, the retainer 91 is provided at a central portion of the container cover 82 to be parallel to an arrangement direction (vertical direction) of the semiconductor wafers W such that the retainer 91 is parallel to one of sides that constitute the rectangular shape of the container cover 82.

The container body 81 has an option attachment hole (not illustrated) for attaching an option 92 (refer to FIG. 5) to the container 80. The option 92 can be attached to the option attachment hole of the container 80. The option 92 to be attached is selectable from options having various shapes, and the type and the like of the container 80 can be distinguished on the basis of the shape of the option 92.

Next, a structure of the lower cushioning material 1 constituting the cushioning material 100 will be described.

Figure 7:
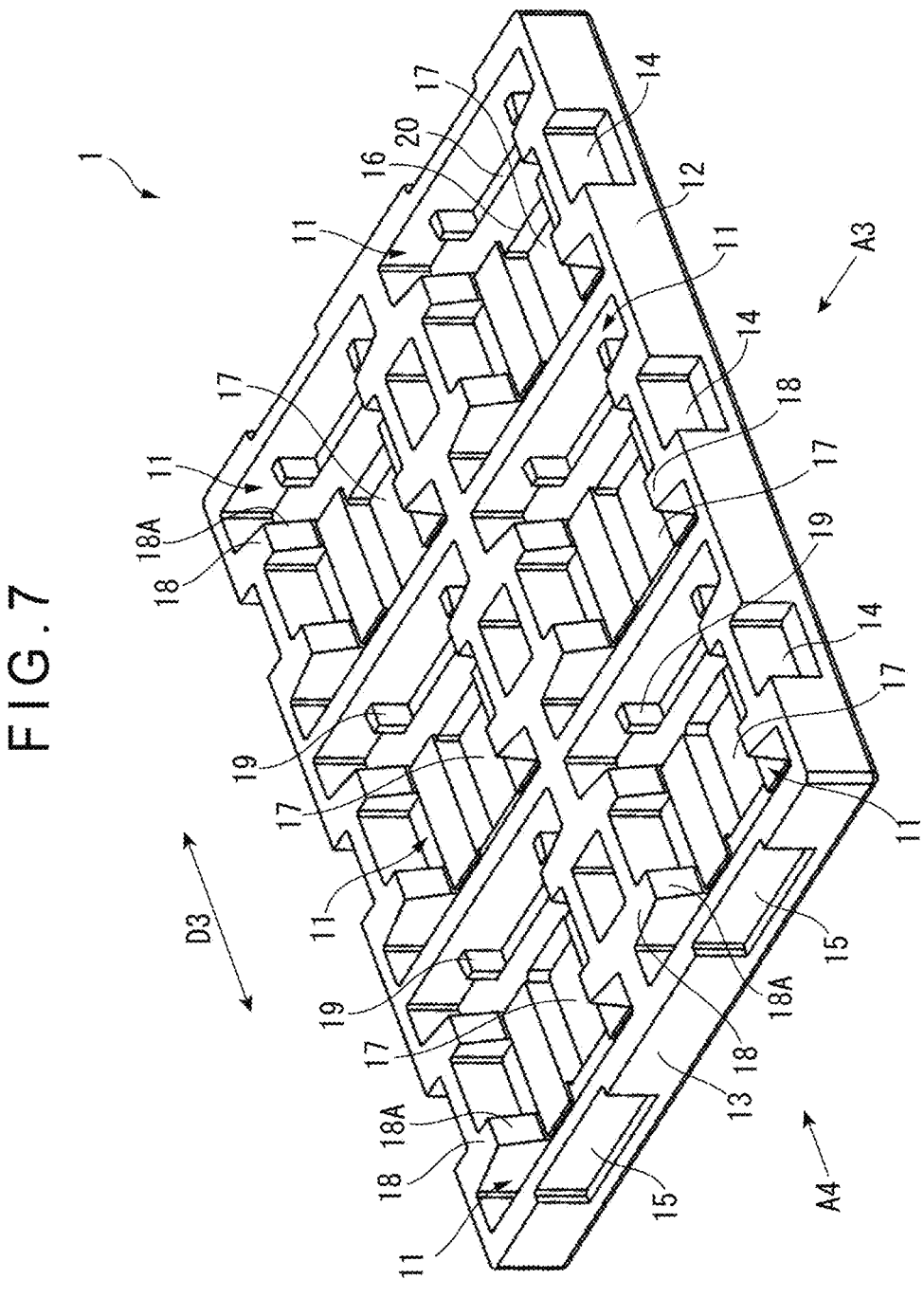
FIG. 7 is a top perspective view of a lower cushioning material in an exemplary embodiment of the invention.
Figure 8:
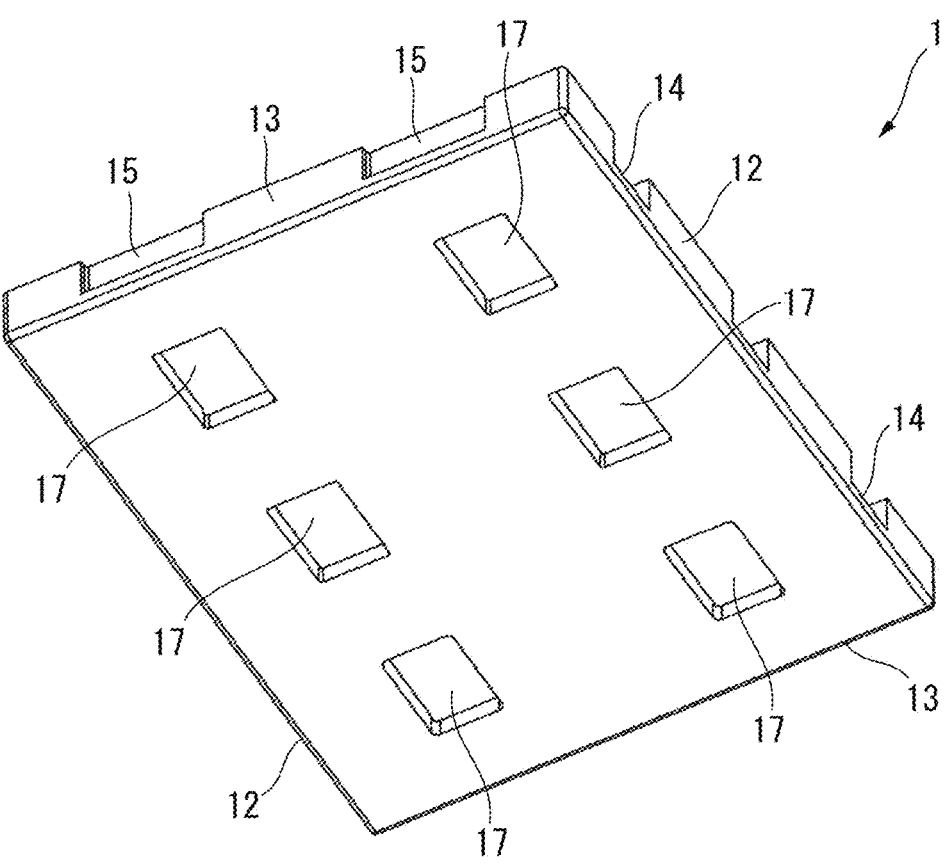
FIG. 8 is a bottom perspective view of the lower cushioning material in the exemplary embodiment of the invention.
Figure 9:
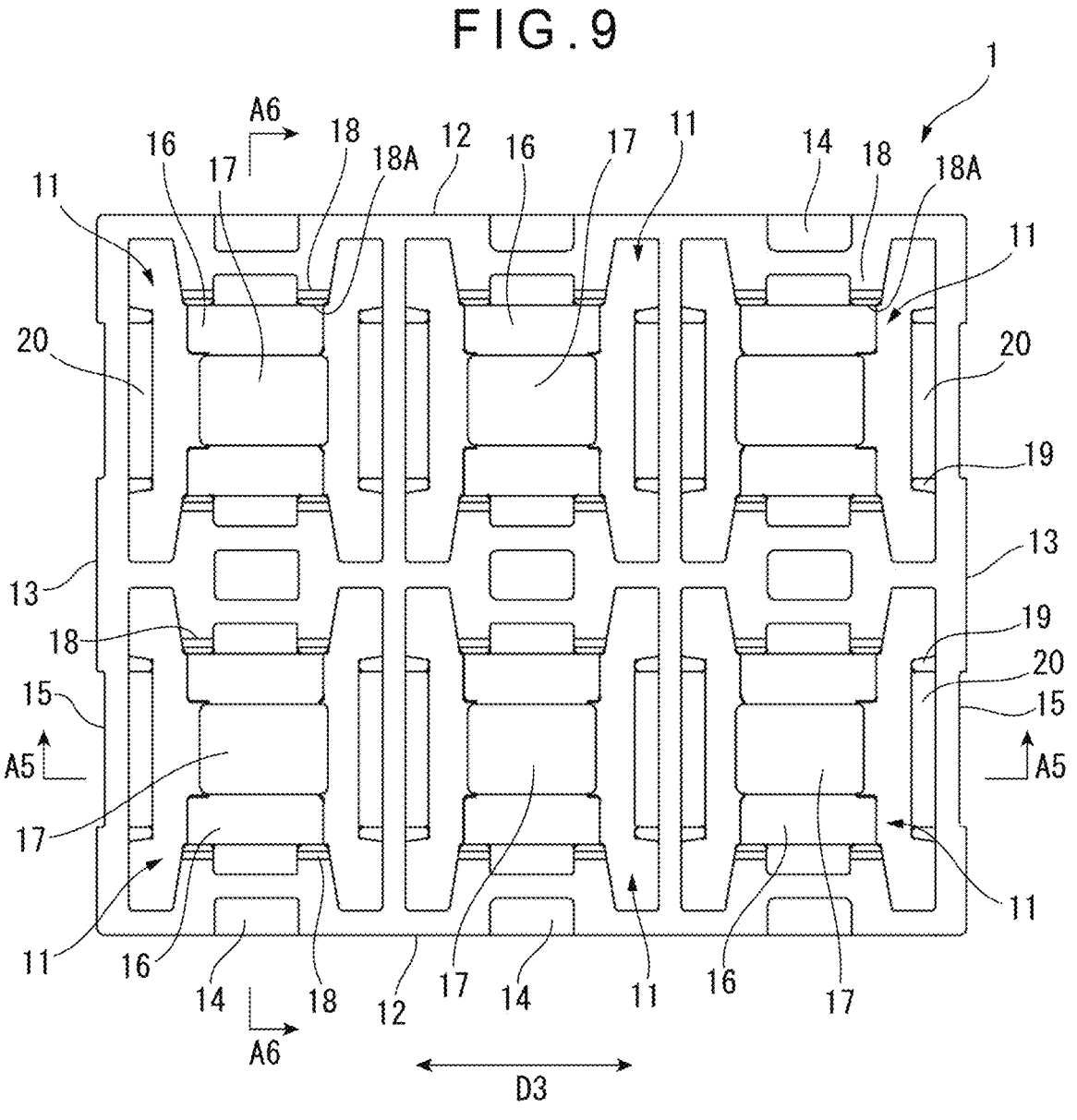
FIG. 9 is a plan view of the lower cushioning material in the exemplary embodiment of the invention.
Figure 10:
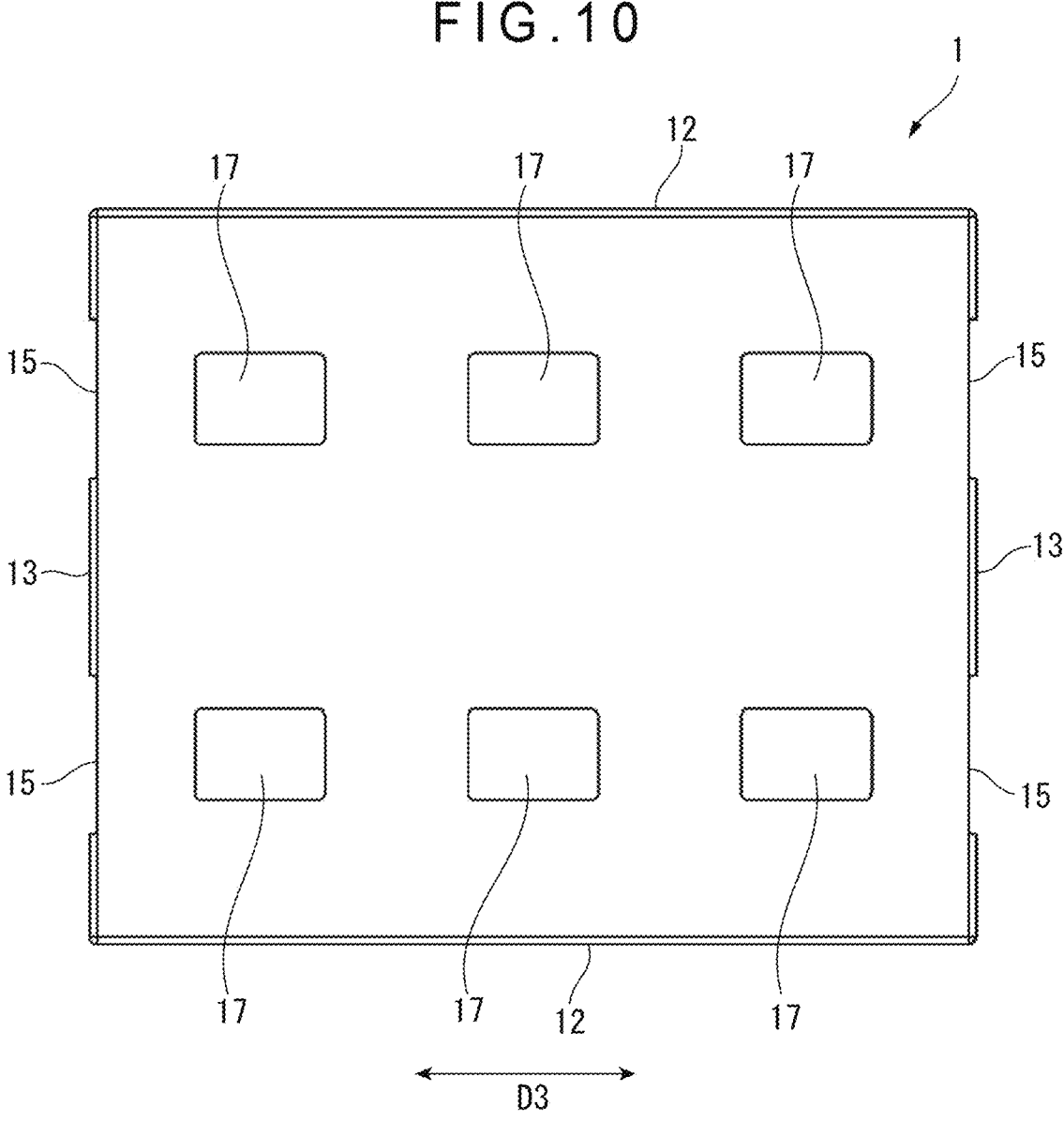
FIG. 10 is a bottom view of the lower cushioning material in the exemplary embodiment of the invention.
Figure 11A:
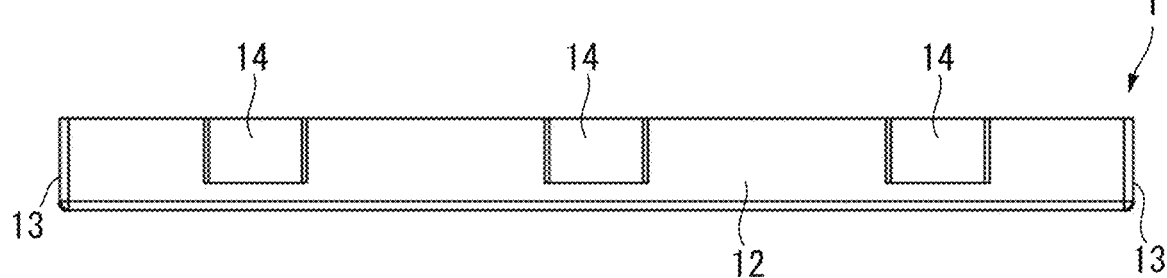
FIG. 11A is a view (a front view of the lower cushioning material) in a direction of an arrow A3 in FIG. 7.
Figure 11B:
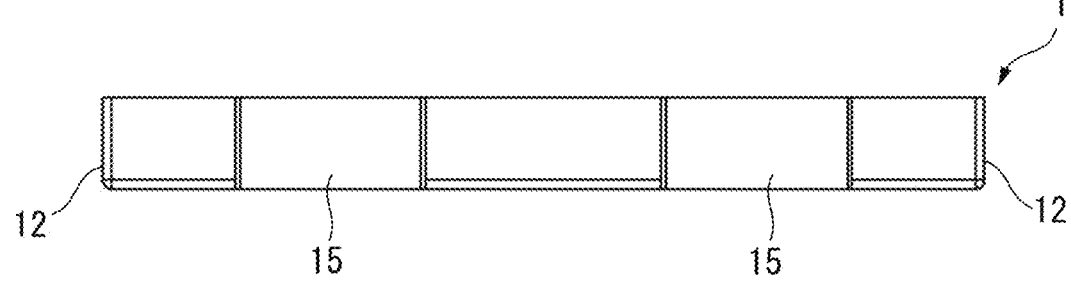
FIG. 11B is a view (a side view of the lower cushioning material) in a direction of an arrow A4 in FIG. 7.
Figures 12A, 12B:
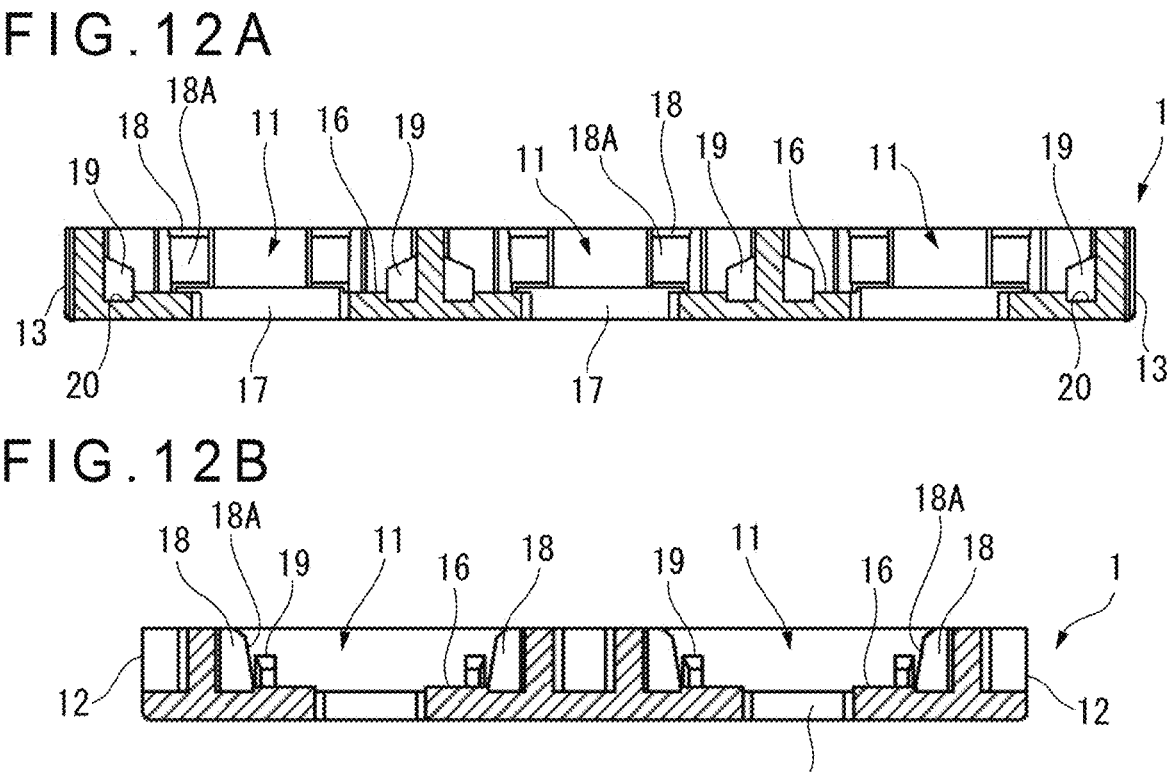
FIG. 12A is a sectional view taken along a line A5-A5 in FIG. 9.
FIG. 12B is a sectional view taken along a line A6-A6 in FIG. 9.

FIG. 7 is a top perspective view of the lower cushioning material 1, and FIG. 8 is a bottom perspective view of the lower cushioning material 1. FIG. 9 is a plan view of the lower cushioning material 1, and FIG. 10 is a bottom view of the lower cushioning material 1. FIG. 11A is a view (a front view of the lower cushioning material 1) in a direction of an arrow A3 in FIG. 7, and FIG. 11B is a view (a side view of the lower cushioning material 1) in a direction of an arrow A4 in FIG. 7. FIG. 12A is a sectional view taken along a line A5-A5 in FIG. 10, and FIG. 12B is a sectional view taken along a line A6-A6 in FIG. 10.

The lower cushioning material 1 is a cushioning material that supports the lower portion of each of the containers 80 in the rows of the containers 80 on the lower tier.

As illustrated in FIG. 7 and other figures, the lower cushioning material 1 has a rectangular shape. The lower cushioning material 1 is formed to cover substantially the entire surface of the bottom plate 202 of the packing case 200. In FIG. 7, the lower cushioning material 1 includes six lower receivers 11 that are formed as recesses between ribs that extend in two vertical rows and one lateral row and at an outer peripheral portion of the lower cushioning material 1. The lower portions of the containers 80 are each received by a corresponding one of the lower receivers 11.

As illustrated in FIG. 2 and FIG. 3, the lower cushioning material 1 is formed without a space between the lower cushioning material 1 and inner surfaces of the side plates 203 of the packing case 200. In other words, the lower cushioning material 1 is formed to be unable to move horizontally when being disposed on the bottom plate 202 of the packing case 200 with the vibration absorber 9 interposed therebetween.

The lower cushioning material 1 has four lateral surfaces, which are four lateral surfaces 12 and 13 in total including the lateral surfaces 12 at the front and the rear and the lateral surfaces 13 at the left and the right in FIG. 7, to be in surface contact with the inner surfaces of the side plates 203 of the packing case 200. Here, the lateral surfaces 12 at the front and the rear in FIG. 7 are lateral surfaces extending in a direction D3 in which the rows of the containers 80 extend, and the lateral surfaces 13 at the left and the right are lateral surfaces orthogonal to the lateral surfaces 12.

The lateral surfaces 12 and 13 of the lower cushioning material 1 are provided with a plurality of recesses 14 and 15, as necessary. In other words, the lateral surfaces 12 and 13 of the lower cushioning material 1 are not required to be in surface contact at the entirety thereof with an inner surface of the packing case 200. In the lower cushioning material 1 of the exemplary embodiment, the lateral surfaces 12 each have three recesses 14, and the lateral surfaces 13 each have two recesses 15. The position of each of the recesses 14 and 15 corresponds to a central position at the lower receiver 11 corresponding thereto.

Each lower receiver 11 is a portion having a shape to which a lower portion of the container 80 is fitted. The lower receiver 11 includes a lower facing surface 16, a lower opening 17, two sets of first lower ribs 18, and two sets of second lower ribs 19.

The lower opening 17 is a rectangular hole that is formed, at a central portion of the lower receiver 11, in the bottom surface of the lower cushioning material 1, that is, the lower facing surface 16.

The first lower ribs 18 and the second lower ribs 19 are protrusions that support the four lateral surfaces (the first walls 83 and the second walls 84) of the container from sides, that position the container 80 received at the lower receiver 11 in the horizontal direction, and that restrict the movement of the container 80.

The first lower ribs 18 and the second lower ribs 19 are disposed such that the two sets of the first lower ribs 18 support lateral surfaces of the container 80 from directions opposite to each other and the two sets of the second lower ribs 19 support, from directions opposite to each other, lateral surfaces that differ from the lateral surfaces supported by the first lower ribs 18.

The two first lower ribs 18 constituting one set of the first lower ribs 18 are disposed to be spaced from each other at predetermined intervals in a direction along a lateral surface of the container 80.

Each of the first lower ribs 18 has a tapered surface 18A that supports a lateral surface of the container 80. The tapered surface 18A is inclined such that, when the container 80 is received at the lower receiver 11, an upper portion of the tapered surface 18A is spaced from the lateral surface of the container body 81 and a lower portion of the tapered surface 18A is in contact with the lateral surface of the container body 81.

The two second lower ribs 19 constituting one set of the second lower ribs 19 are disposed to be spaced from each other predetermined intervals in a direction along a lateral surface of the container 80 differing from the lateral surface supported by the first lower ribs 18. These second lower ribs 19 restrict the movement of the container 80 in the direction D3.

As illustrated in FIG. 7, FIG. 9, FIG. 12A, and FIG. 12B, each of the lower receivers 11 has a hollow 20 for receiving the option 92 when the container 80 to which the option 92 (refer to FIG. 5) is attached is received. The hollow 20 is formed between one set of the second lower ribs 19 that are spaced from each other. The hollow 20 is a recessed portion formed in the lower facing surface 16 of the lower receiver 11.

Next, a structure of each upper cushioning material 5 constituting the cushioning material 100 will be described.

Figure 13:
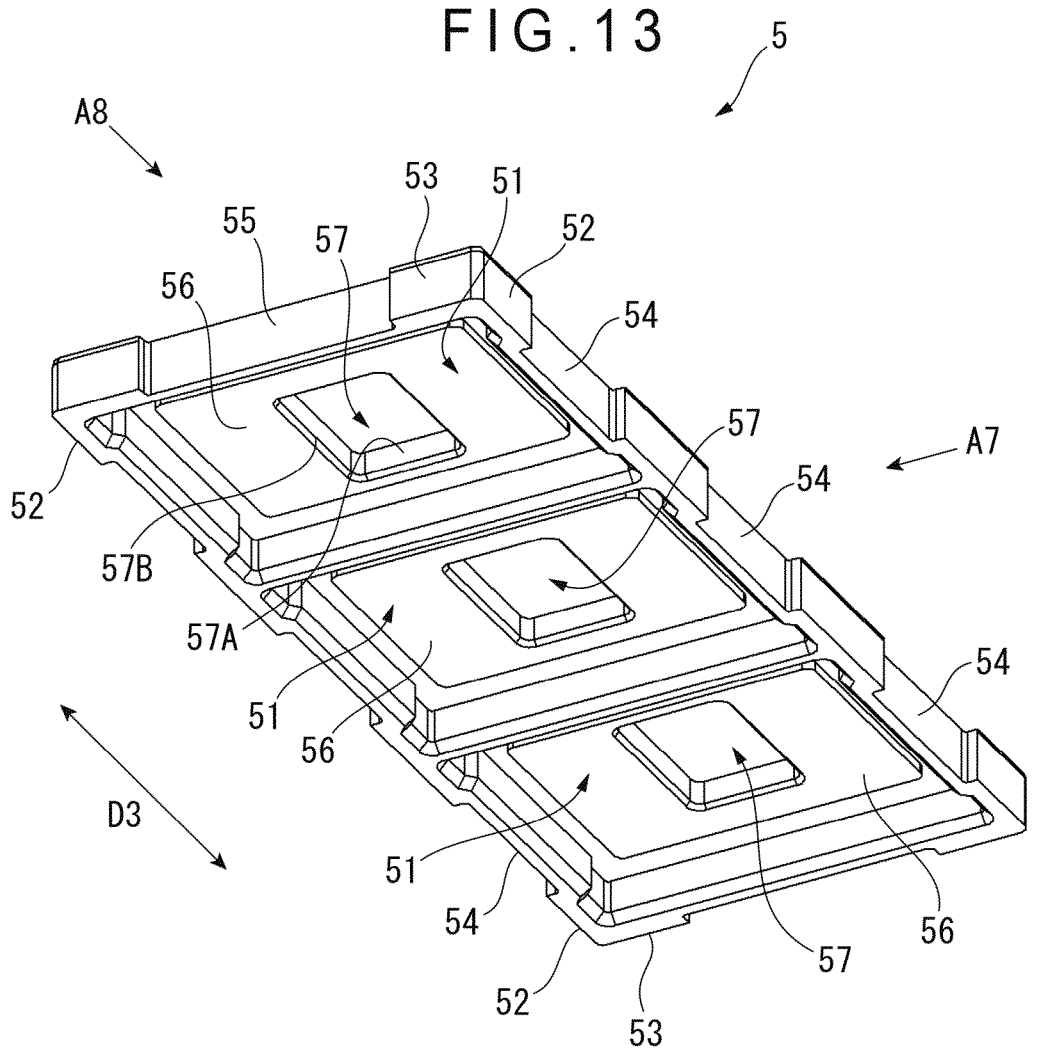
FIG. 13 is a bottom perspective view of an upper cushioning material in the exemplary embodiment of the invention.
Figure 14:
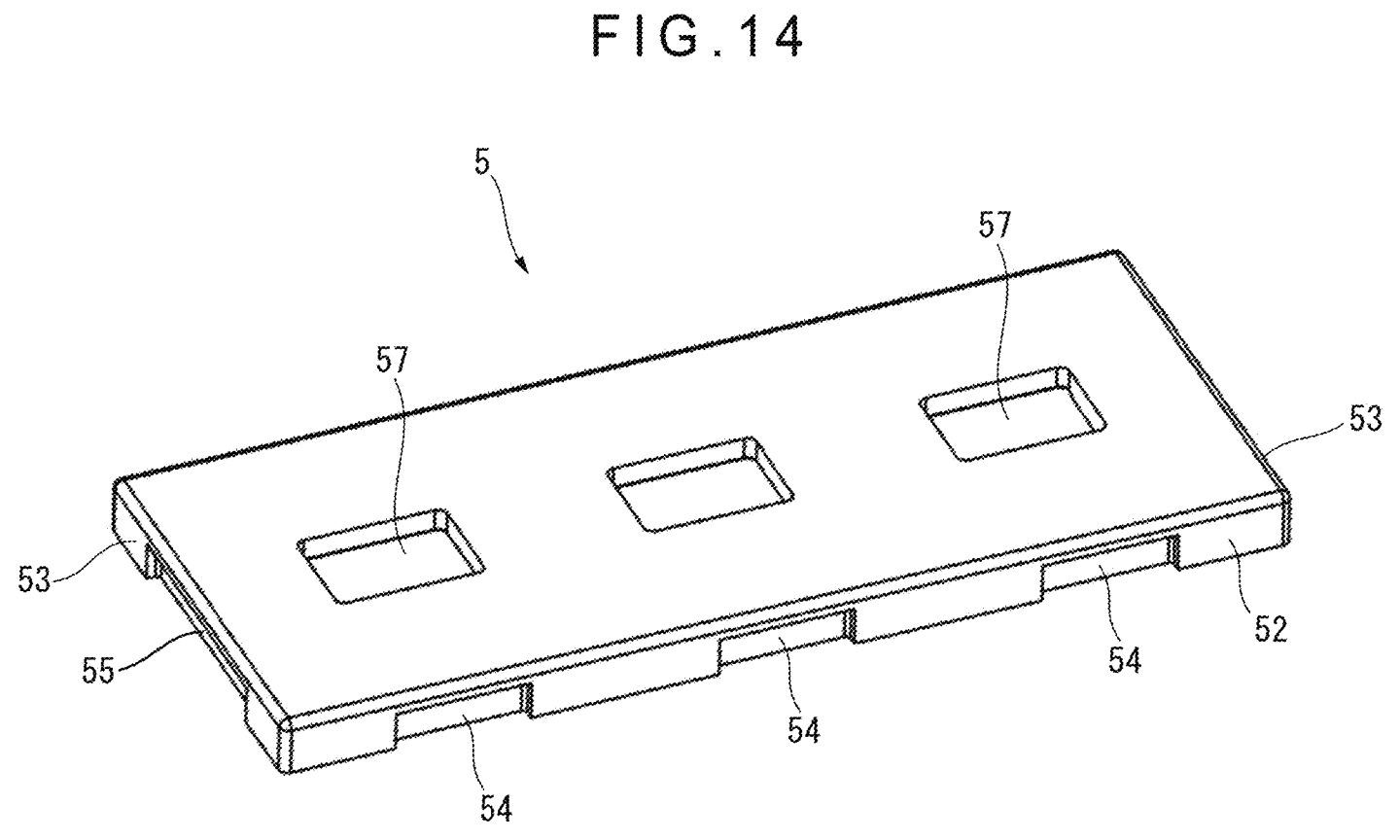
Figures 15A, 15B:
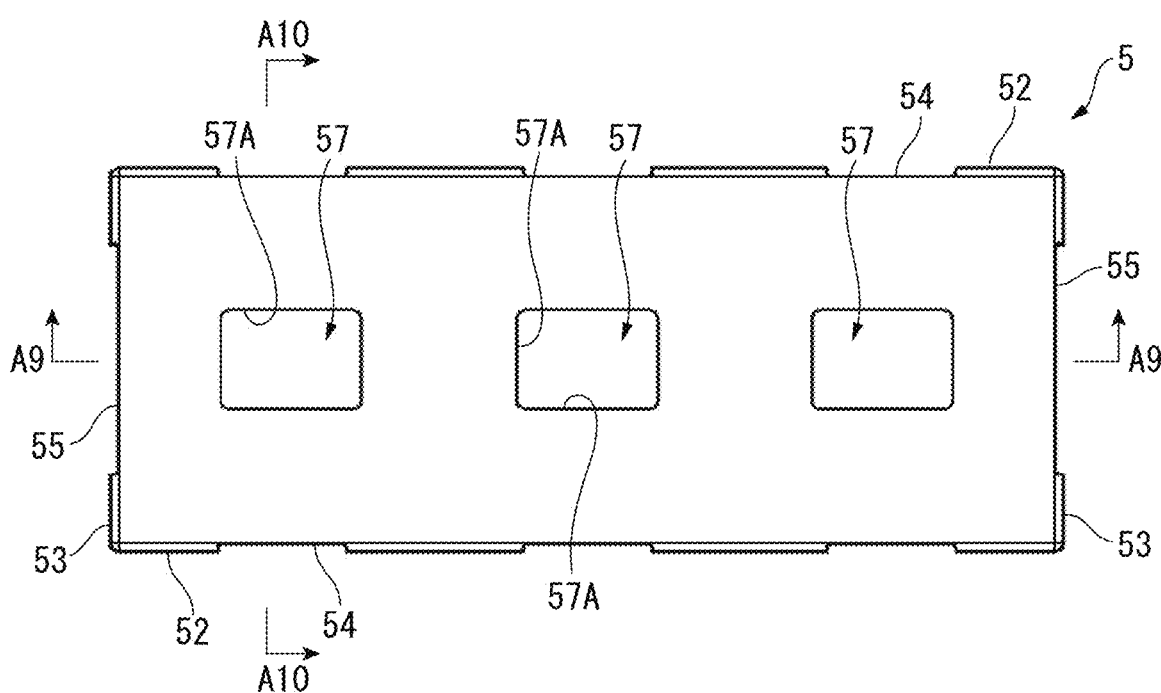
FIG. 15A is a plan view of the upper cushioning material.
FIG. 15B is a bottom view of the upper cushioning material.
Figures 16A, 16B:
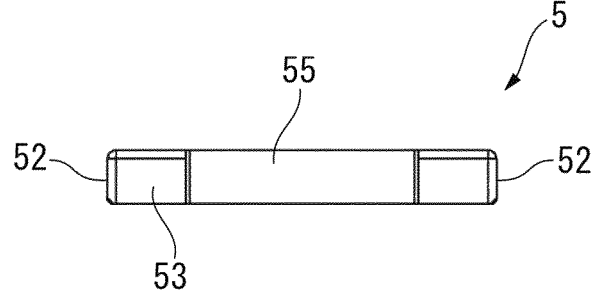
FIG. 16A is a view (a front view of the upper cushioning material) in a direction of an arrow A7 in FIG. 13.
FIG. 16B is a view (a side view of the upper cushioning material) in a direction of an arrow A8 in FIG. 13.
Figure 17A:
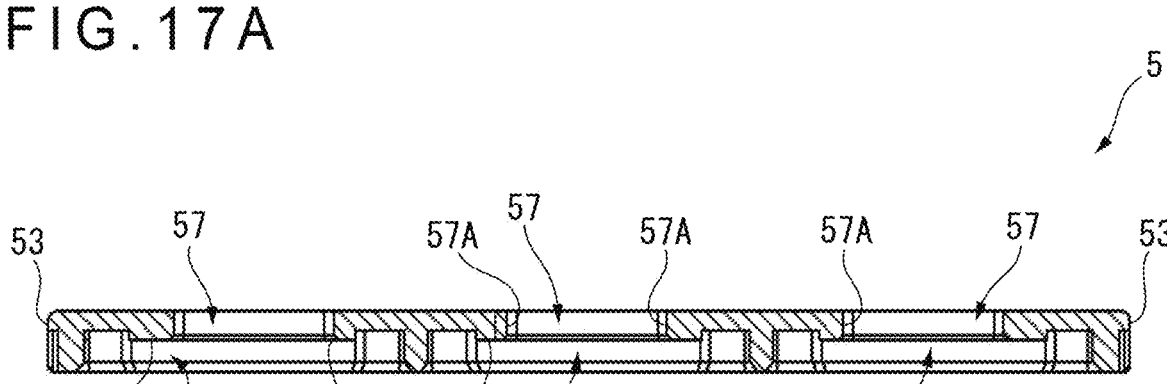
FIG. 17A is a sectional view taken along a line A9-A9 in FIG. 15A.
Figure 17B:
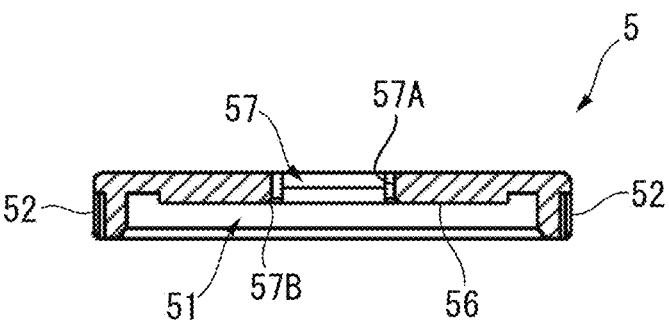
FIG. 17B is a sectional view taken along a line A10-A10 in FIG. 15A.

FIG. 13 is a bottom perspective view of the upper cushioning material 5, and FIG. 14 is a top perspective view of the upper cushioning material 5. FIG. 15A is a plan view of the upper cushioning material 5, and FIG. 15B is a bottom view of the upper cushioning material 5. FIG. 16A is a view (a front view of the upper cushioning material 5) in a direction of an arrow A7 in FIG. 13, and FIG. 16B is a view (a side view of the upper cushioning material 5) in a direction of an arrow A8 in FIG. 13. FIG. 17A is a sectional view taken along a line A9-A9 in FIG. 15A, and FIG. 17B is a sectional view taken along a line A10-A10 in FIG. 15A.

Figure 4:
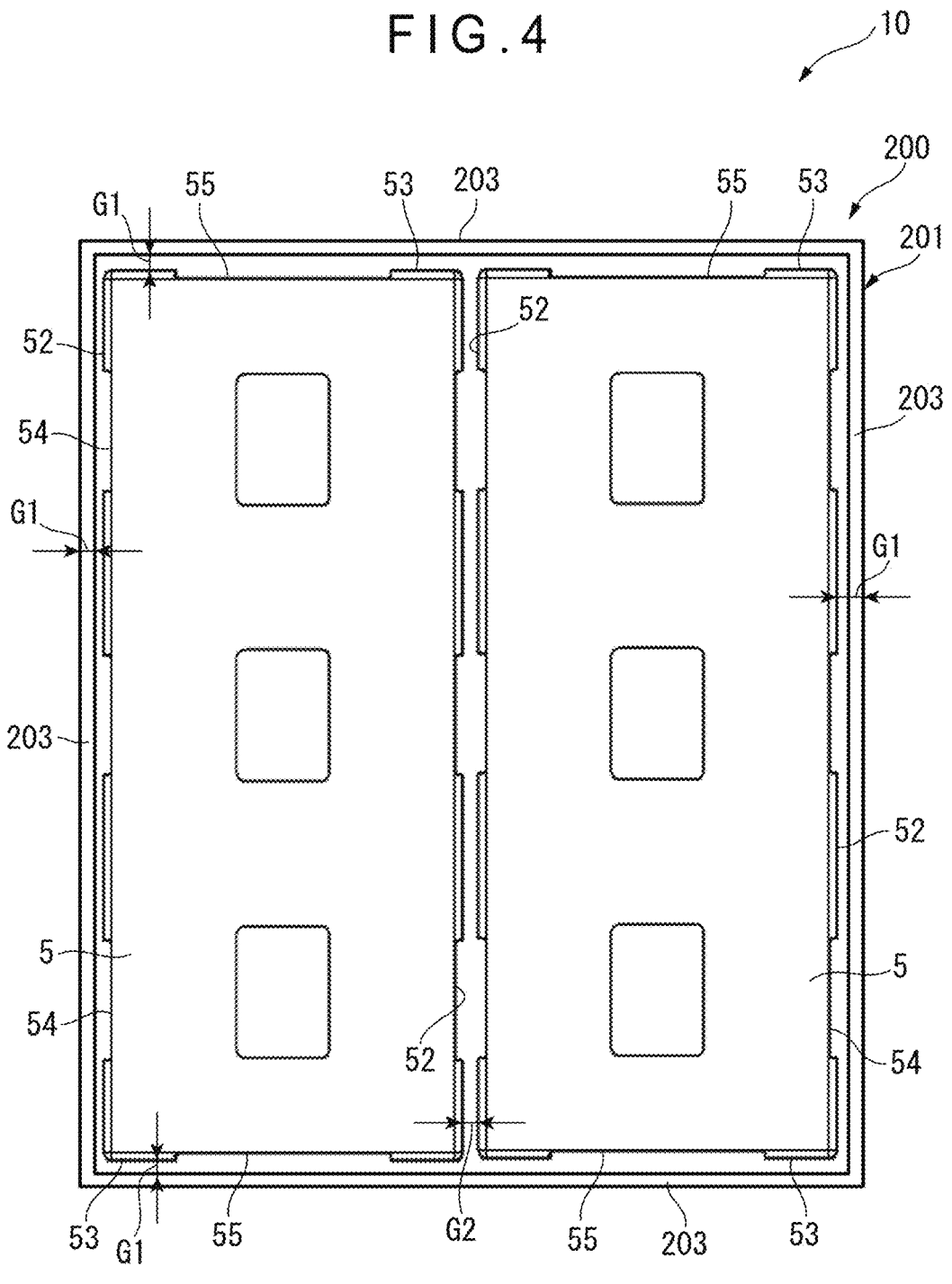
FIG. 4 is a plan view of the packing body from which a case cover is detached.

The upper cushioning materials 5 are cushioning materials that hold upper portions of the containers 80 in the rows of the containers 80 on the upper tier. As illustrated in FIG. 13, FIG. 14, FIG. 15A, and FIG. 15B, each of the upper cushioning materials 5 has a rectangular shape. As illustrated in FIG. 4, two upper cushioning materials 5 are used as one set in the packing body 10, and each of the upper cushioning materials 5 is formed to cover substantially half of an opening of the packing case 200.

As illustrated in FIG. 13 and FIG. 15B, the upper cushioning materials 5 each include three upper receivers 51. Each of the upper receivers 51 holds the container cover 82 of the container 80 corresponding thereto. The upper receivers 51 each have an upper facing surface 56 and an upper opening 57.

The upper cushioning materials 5 each have four lateral surfaces, which are four lateral surfaces 52 and 53 in total including the lateral surfaces 52 at the front and the rear and the lateral surfaces 53 at the left and the right in FIG. 13. Among the four lateral surfaces 52 and 53, the lateral surfaces 52 are lateral surfaces extending in the direction D3 in which the rows of the containers 80 extend, and the lateral surfaces 53 are lateral surfaces orthogonal to the lateral surfaces 52.

As illustrated in FIG. 2 to FIG. 4, the upper cushioning materials 5 are formed such that two upper cushioning materials 5 are accommodated in the packing body 10 to be adjacent to each other inside the case body 201 with a space G1 provided between an inner surface of the case body 201 and an outer peripheral surface of these two upper cushioning materials 5 as a whole, that is, each of the three lateral surfaces 52 and 53 facing the inner surface of the case body 201. The case body 201 and the upper cushioning materials 5 are formed such that the space G1 has a dimension in a range from 5 mm to 20 mm.

The upper cushioning materials 5 are also formed such that a cushioning-material interval G2 is provided between the upper cushioning materials 5 adjacent to each other in the packing body 10. The upper cushioning materials 5 are formed such that the cushioning-material interval G2 has a dimension in a range from 5 mm to 20 mm.

The lateral surfaces 52 and 53 of the upper cushioning materials 5 are provided, as necessary, with a plurality of recesses 54 and 55 that are formed to be recessed in a direction away from the inner surface of the packing case 200 in the packing body 10. In other words, the lateral surfaces of the upper cushioning materials 5 may be not flat. In the upper cushioning materials 5 of the exemplary embodiment, each of the lateral surfaces 52 has three recesses 54, and each of the lateral surfaces 53 has one recess 55. The position of each of the recesses 54 and 55 corresponds to a central position at the upper receiver 51 corresponding thereto.

The upper opening 57 is a rectangular hole that is formed, at a central portion of the upper receiver 51, in an upper surface of the upper cushioning material 5, in other words, the upper facing surface 56 and that extends through the upper cushioning material 5 between the upper surface and a lower surface of the upper cushioning material 5.

As illustrated in FIG. 17A and FIG. 17B, each upper opening 57 has four principal surfaces 57A extending in the vertical direction and a finger rest 57B formed at a lower end of the principal surfaces 57A. The finger rest 57B is an inclined surface having a shape formed by slantingly shaving a corner of a ridge between the upper facing surface 56 and the principal surfaces 57A of the upper opening 57.

The finger rest 57B is not necessarily formed to be an inclined surface such as that described above as long as the finger rest 57B has a shape that allows a worker to insert his/her fingers between the container cover 82 of the container 80 and the principal surfaces 57A to detach the upper cushioning materials 5. For example, a stepped shape recessed with respect to the principal surfaces 57A may be employed. The finger rest 57B is also not necessarily formed to extend over the total length of the ridge between the upper facing surface 56 and the principal surfaces 57A and may be formed at a portion of the ridge.

Next, a structure of each middle cushioning material 3 will be described.

Figure 19:
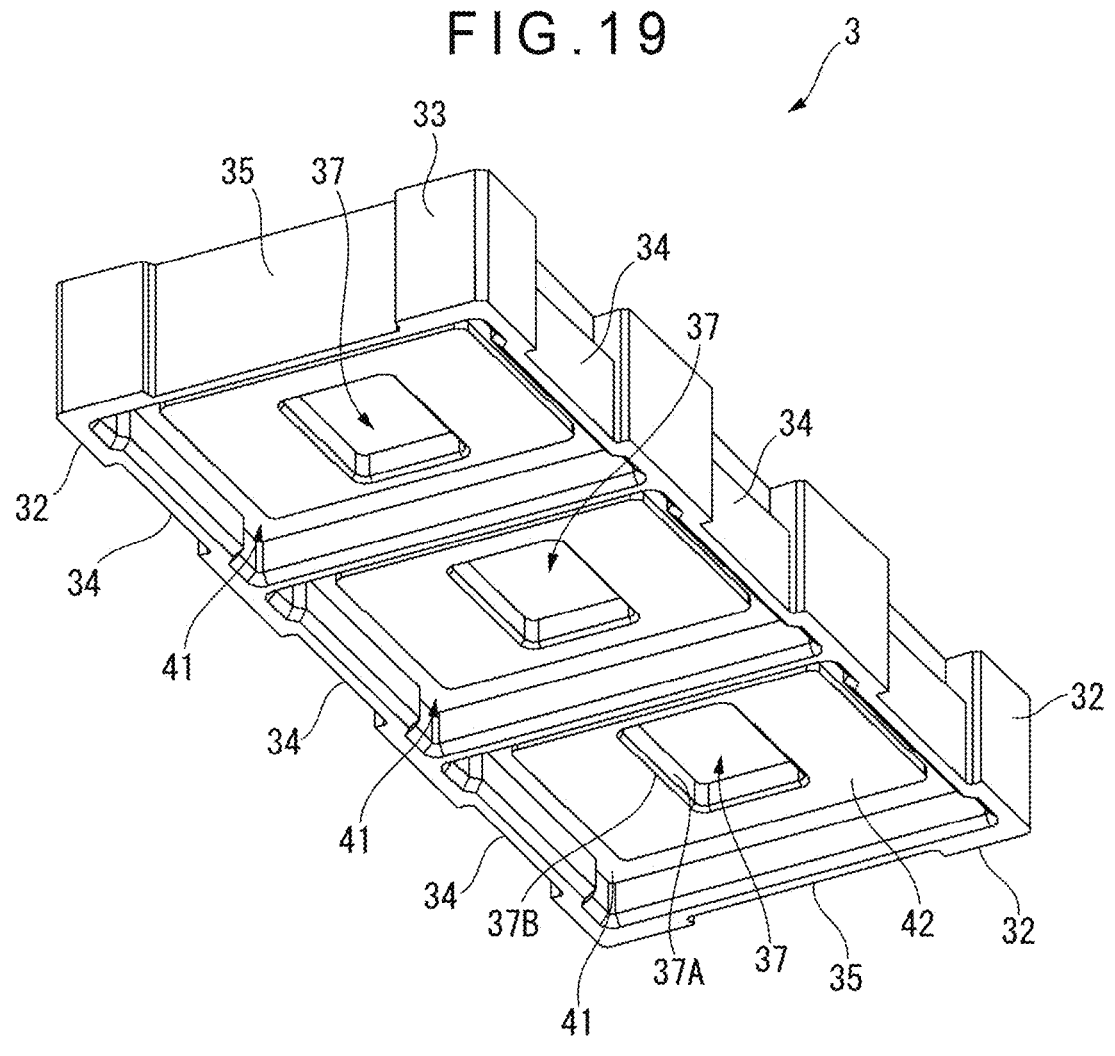
FIG. 19 is a bottom perspective view of the middle cushioning material in the exemplary embodiment of the invention.
Figure 20A:
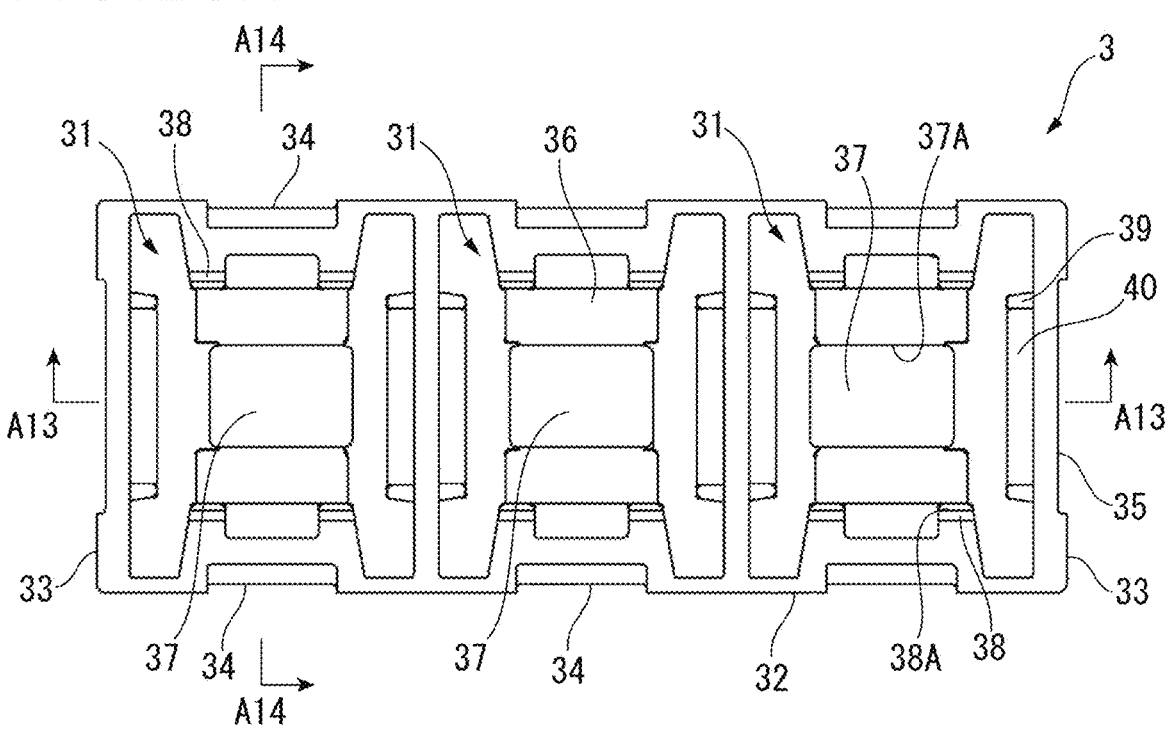
FIG. 20A is a plan view of the middle cushioning material.
Figure 20B:
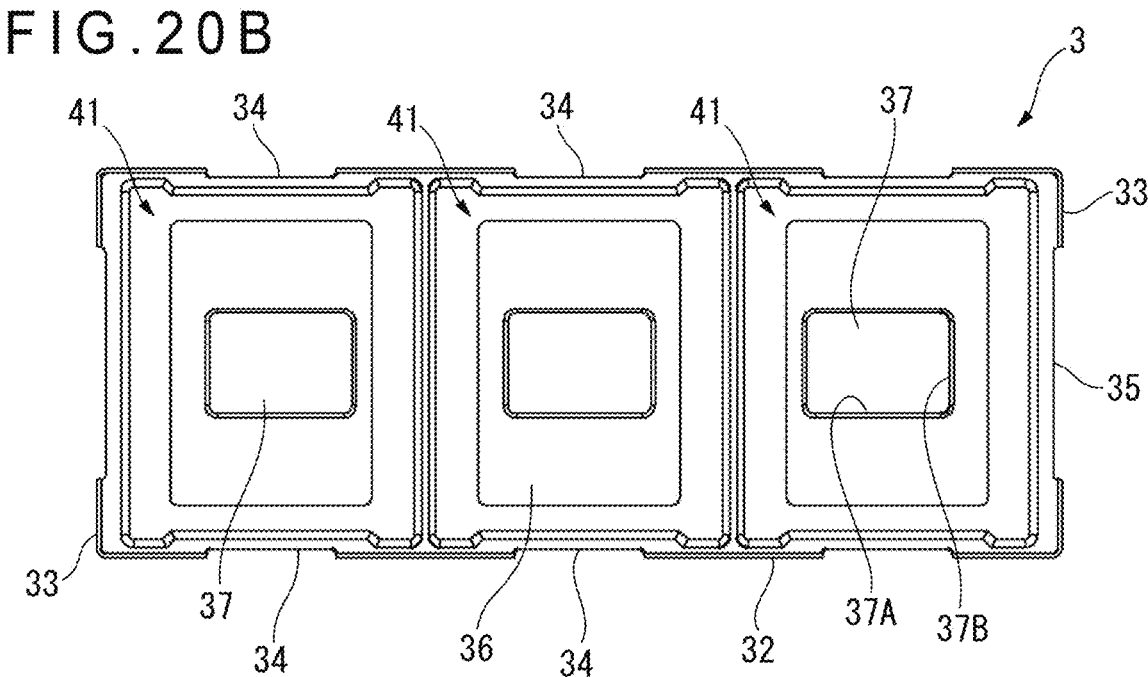
FIG. 20B is a bottom view of the middle cushioning material.
Figure 21A:
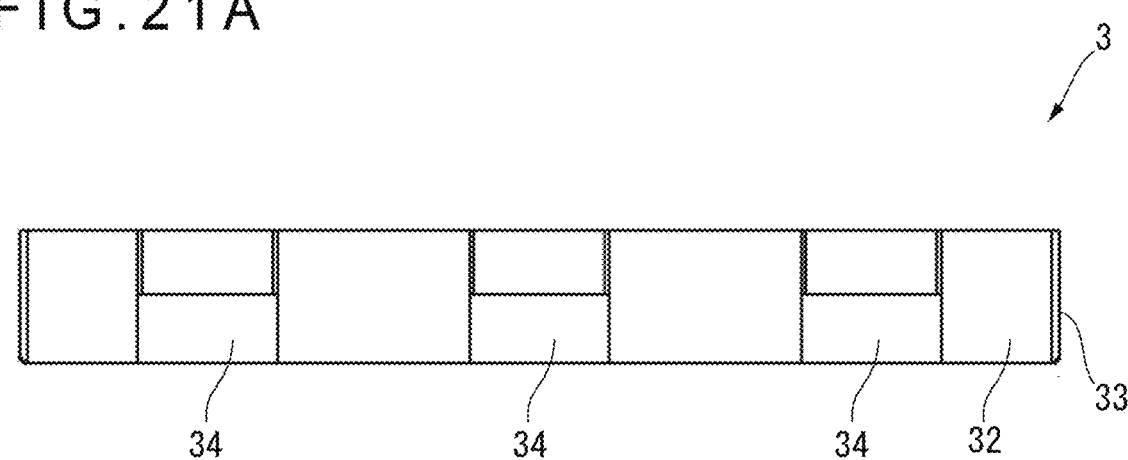
FIG. 21A is a view (a front view of the middle cushioning material) in a direction of an arrow A11 in FIG. 18.
Figure 21B:
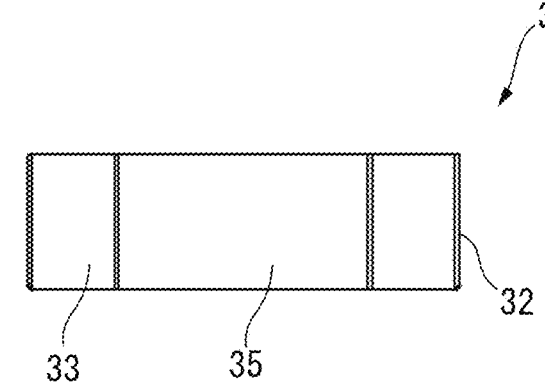
FIG. 21B is a view (a side view of the middle cushioning material) in a direction of an arrow A12 in FIG. 18.
Figure 22A:
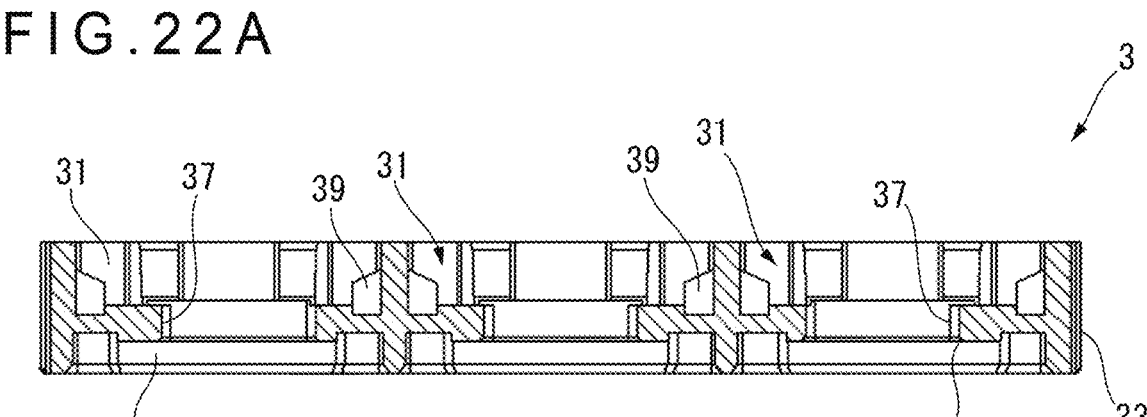
FIG. 22A is a sectional view taken along a line A13-A13 in FIG. 20A.
Figure 22B:
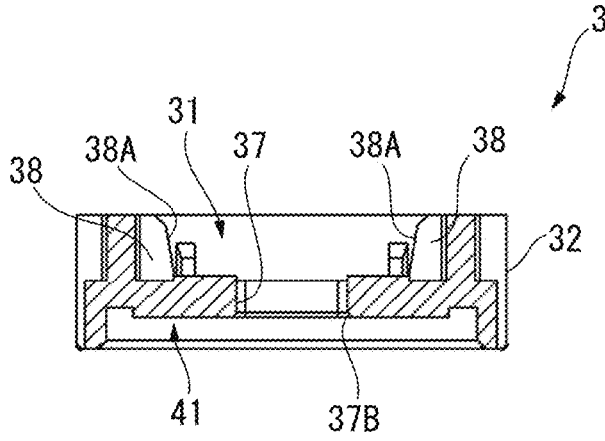
FIG. 22B is a sectional view taken along a line A14-A14 in FIG. 20A.

FIG. 18 is a top perspective view of the middle cushioning material 3, and FIG. 19 is a bottom perspective view of the middle cushioning material 3. FIG. 20A is a plan view of the middle cushioning material 3, and FIG. 20B is a bottom view of the middle cushioning material 3. FIG. 21A is a view (a front view of the middle cushioning material 3) in a direction of an arrow A11 in FIG. 18, and FIG. 21B is a view (a side view of the middle cushioning material 3) in a direction of an arrow A12 in FIG. 18. FIG. 22A is a sectional view of the middle cushioning material 3 taken along a line A13-A13, and FIG. 22B is a sectional view of the middle cushioning material 3 taken along a line A14-A14.

The middle cushioning materials 3 are cushioning materials that hold upper portions of the containers 80 in the rows of the containers 80 on the lower tier and that support lower portions of the containers 80 in the rows of the containers 80 on the upper tier.

As illustrated in FIG. 18, FIG. 19, FIG. 20A, and FIG. 20B, each of the middle cushioning materials 3 has a rectangular shape. Similarly to the upper cushioning materials 5, two middle cushioning materials 3 are used as one set in the packing body 10.

As illustrated in FIG. 18 and FIG. 20A, three middle body receivers 31 similar to the lower receivers 11 of the lower cushioning material 1 are formed at an upper surface (a surface facing upward in the packing body 10) of each of the middle cushioning materials 3.

As illustrated in FIG. 19 and FIG. 20B, middle cover receivers 41 similar to the upper receivers 51 of the upper cushioning materials 5 are formed at a lower surface (a surface facing downward in the packing body 10) of each of the middle cushioning materials 3.

Each middle cushioning material 3 has four lateral surfaces, which are four lateral surfaces 32 and 33 in total including the lateral surfaces 32 at the front and the rear and the lateral surfaces 33 at the left and the right in FIG. 18. Among the four lateral surfaces 32 and 33, the lateral surfaces 32 are lateral surfaces extending in the direction D3 in which the rows of the containers 80 extend, and the lateral surfaces 33 are lateral surfaces orthogonal to the lateral surfaces 32.

Similarly to the upper cushioning materials 5, the middle cushioning materials 3 are formed such that two middle cushioning materials 3 are accommodated in the packing body 10 to be adjacent to each other inside the case body 201 with the space G1 provided between the inner surface of the case body 201 and an outer peripheral surface of these two middle cushioning materials 3 as a whole, that is, each of the three lateral surfaces 32 and 33 facing the inner surface of the case body 201. The case body 201 and the middle cushioning materials 3 are formed such that the space G1 has a dimension in a range from 5 mm to 20 mm.

In addition, similarly to the upper cushioning materials 5, the middle cushioning materials 3 are formed such that the cushioning-material interval G2 is provided between the middle cushioning materials 3 adjacent to each other in the packing body 10. The middle cushioning materials 3 are formed such that the cushioning-material interval G2 has a dimension in a range from 5 mm to 20 mm.

The lateral surfaces 32 and 33 of the middle cushioning materials 3 are provided, as necessary, with a plurality of recesses 34 and 35 formed to be recessed in the direction away from the inner surface of the packing case 200 in the packing body 10. In other words, the lateral surfaces of the middle cushioning materials 3 may be not flat. In the middle cushioning materials 3 of the exemplary embodiment, each of the lateral surfaces 32 has three recesses 34, and each of the lateral surfaces 33 has one recess 35. The position of each of the recesses 34 and 35 corresponds to a central position at the middle body receiver 31 or the middle cover receiver 41 corresponding thereto.

As illustrated in FIG. 18, each of the middle body receivers 31 has a middle body facing surface 36, a middle opening 37, two sets of first middle ribs 38, two sets of second middle ribs 39, and a hollow 40. Each of the first middle ribs 38 has a tapered surface 38A having a shape and a function that are similar to those of the tapered surface 18A of the lower cushioning material 1.

Each of the first middle ribs 38 has a shape and a function that are similar to those of the first lower ribs 18 of the lower cushioning material 1, and each of the second middle ribs 39 has a shape and a function that are similar to those of the second lower ribs 19 of the lower cushioning material 1.

The hollow 40 has a shape and a function that are similar to those of the hollow 20 of the lower cushioning material 1.

As illustrated in FIG. 19, the middle cover receivers 41 each include a middle cover facing surface 42.

Similarly to the upper opening 57 of each of the upper cushioning materials 5, the middle opening 37 includes a finger rest 37B formed at a lower end of principal surfaces 37A. The finger rest 37B has a shape and a function that are similar to those of the finger rest 37B of the upper cushioning material 5.

Next, a structure of the vibration absorber 9 will be described with reference to FIG. 2 and FIG. 3.

The vibration absorber 9 is a member that absorbs vibration generated during packing of the containers 80 and includes plates 9A and 9B and elastic bodies 9C.

The plates 9A and 9B are each a plate-shaped member having a rectangular shape substantially similar to the shape of the bottom plate 202 of the packing case 200. In packing, the plate 9B is first disposed on the bottom plate 202 of the packing case 200, and the plate 9A is then disposed on plate 9B with the elastic bodies 9C interposed therebetween. The plates 9A and 9B are each constituted by, for example, a plastic plate.

Each elastic body 9C is a member that elastically deforms in response to vibration and thereby absorbs the vibration. The elastic bodies 9C, which are provided between the plates 9A and 9B, are formed from, for example, polyurethane, synthetic rubber, or polyurethane.

In a packing method using the aforementioned cushioning material 100, the cushioning material 100 is disposed such that, in a state where the vibration absorber 9 is disposed inside the packing case 200, the lower cushioning material 1 supports the lower portions of the two rows of the containers 80 on the lower tier, the middle cushioning materials 3 are interposed one each between the containers 80 on the upper tier and the containers 80 on the lower tier in each of the rows of the containers 80, and the upper cushioning materials 5 are disposed one each in each of the two rows of the containers 80 on the upper tier. The middle cushioning materials 3 and the upper cushioning materials 5 are disposed with a predetermined space between each of the middle cushioning materials 3 and the side plates 203 of the packing case 200 and between each of the upper cushioning materials 5 and the side plates 203 of the packing case 200.

According to the aforementioned exemplary embodiment, the middle cushioning materials 3 and the upper cushioning materials 5 are formed with the predetermined space G1 between each of the middle cushioning materials 3 and the side plates 203 of the packing case 200 and between each of the upper cushioning materials 5 and the side plates 203 of the packing case 200. It is thus possible to stably perform work to detach or attach the cushioning material 100 (the upper cushioning materials 5 and the middle cushioning materials 3) by a work robot or the like after detaching the case cover 204 of the packing case 200.

In addition, with the lower cushioning material 1 being formed without a space between the lower cushioning material 1 and the side plates 203 of the packing case 200, the horizontal movement of the lower cushioning material 1 supporting the containers 80 from below inside the packing case 200 can be inhibited.

Further, with the finger rests 57B and 37B being respectively formed at the upper opening 57 of each upper cushioning material 5 and the middle opening 37 of each middle cushioning material 3, a worker is enabled to remove the upper cushioning materials 5 and the middle cushioning materials 3 easily by placing his/her fingers on the inner side of the openings.

In addition, a contact area where each upper cushioning material 5 or each middle cushioning material 3 is brought into contact with the inner surface of the packing case 200 is reduced by the recesses 54 and 55 being formed at the lateral surfaces 52 and 53 of the upper cushioning materials 5 and the recesses 34 and 35 being formed at the lateral surfaces 32 and 33 of the middle cushioning materials 3. It is thus possible to reduce contact resistance when each upper cushioning material 5 or each middle cushioning material 3 is brought into contact with the packing case 200, improving stability in removal of the cushioning materials.

Further, with the ribs 18 and 19 being provided at the lower receivers 11 of the lower cushioning material 1 and the ribs 38 and 39 being provided at the middle body receivers 31 of the middle cushioning materials 3, wobbling of the containers 80 during transport can be inhibited by these ribs that are in contact with the lateral surfaces of the containers 80.

Moreover, the hollows 20 and 40 provided at the lower receivers 11 of the lower cushioning material 1 and the middle body receivers 31 of the middle cushioning materials 3 can prevent a packaging bag for a semiconductor storage case from being damaged that may otherwise be caused by contact between the option 92 and the cushioning material 100 during packing of the container 80 to which the option 92 is attached.

According to the exemplary embodiment, the cushioning material 100 is constituted by a foam body whose expansion ratio is in a range from 20 times to 40 times. It is thus possible to achieve both the hardness for withstanding impact from outside and softness for absorbing the impact.

In addition, according to the exemplary embodiment, the cushioning material 100 is formed from polyurethane foam, polyethylene foam, polypropylene foam, or polystyrene foam.

Therefore, the cushioning material 100 can be easily formed as a foam body whose expansion ratio is in a range from 20 times to 40 times.

While the invention has been described above on the basis of an exemplary embodiment, the invention is not limited to the aforementioned exemplary embodiment. It is natural for a person skilled in the art to arrive at various modifications and improved examples within the scope of the idea of the invention, and these are also included in the scope of the invention.

The invention claimed is:

1. A packing body comprising:
   a packing case including
   a bottom plate,
   side plates, and
   a cover covering the packing case,
   a plurality of containers configured to be received in the packing case, each container configured to store a semiconductor wafer; and
   cushioning material disposed within the packing case and configured to provide support surfaces to support lower portions of the plurality of containers in two rows in an upper tier and a lower tier below the upper tier, the cushioning material including
   a lower cushioning material having support surfaces configured to support a lower portion of each of the two rows of the containers in the lower tier;
   middle cushioning materials above the lower cushioning material and having
   support surfaces configured to support lower portions of the containers in the two rows in the upper tier, and
   surfaces configured to contact upper portions of the containers in the lower tier in each of the two rows of the containers; and
   upper cushioning materials above the middle cushioning materials and having surfaces configured to contact upper portions of the containers in each of the two rows in the upper tier, wherein
   the lower cushioning material is positioned to abut and be in direct contact with at least one of the side plates without a space between the lower cushioning material and the side plates,
   the middle cushioning materials are configured and positioned to be spaced from the side plates with a first gap between the middle cushioning materials and the side plates and without any other material positioned in the first gap, and
   the upper cushioning materials are configured and positioned to be spaced from the side plates with a second gap between the upper cushioning materials and the side plates and without any other material positioned in the second gap.

2. The packing body according to claim 1, wherein at least the upper cushioning materials or the middle cushioning materials each comprise, at a lateral surface extending along an inner surface of the packing case, a recess that is formed to be recessed in a direction away from the inner surface of the packing case.

3. The packing body according to claim 1, wherein the first gap is in a range from 5 mm to 20 mm.

4. The packing body according to claim 1, wherein the upper cushioning materials comprise two upper cushioning materials having a predetermined cushioning-material interval therebetween.

5. The packing body according to claim 1, wherein the middle cushioning materials comprise two middle cushioning materials having a predetermined cushioning-material interval therebetween.

6. The packing body according to claim 4, wherein the cushioning-material interval is in a range from 5 mm to 20 mm.

7. A packing method using the packing body according to claim 1, the packing method comprising:
   disposing the plurality of containers in the packing case of the packing body;

disposing the cushioning material within the packing case to provide support surfaces to support lower portions of the plurality of containers in two rows in the upper tier and the lower tier below the upper tier, including supporting the lower portion of each of the two rows of the containers in the lower tier with the lower cushioning material, supporting the lower portions of the containers in the two rows in the upper tier with the middle cushioning materials, contacting the upper portions of the containers in the lower tier in each of the two rows of the containers with surfaces of the middle cushioning materials, contacting the upper portions of the containers in each of the two rows in the upper tier with surfaces of the upper cushioning materials;

positioning the lower cushioning material to abut and be in direct contact with at least one of the side plates without the space between the lower cushioning material and the side plates;

positioning the middle cushioning material to be spaced from the side plates with the first gap between the middle cushioning materials and the side plates and without any other material positioned in the first gap; and positioning the upper cushioning materials to be spaced from the side plates with the second gap between the upper cushioning materials and the side plates and without any other material positioned in the second gap.

8. The packing body according to claim 1, wherein the first and second gaps are of sufficient size to accommodate stable robotic positioning of the upper and middle cushioning material in and stable robotic detachment of the upper and middle cushioning material from the packing case.

\* \* \* \* \*